United States Patent
Shoji

(10) Patent No.: US 7,902,811 B2
(45) Date of Patent: *Mar. 8, 2011

(54) CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 189 days.

This patent is subject to a terminal disclaimer.

(21) Appl. No.: 11/526,683

(22) Filed: Sep. 26, 2006

(65) Prior Publication Data

US 2007/0090825 A1 Apr. 26, 2007

(30) Foreign Application Priority Data

Sep. 30, 2005 (JP) ................................. 2005-288823

(51) Int. Cl.
*G01R 15/18* (2006.01)
*G01R 15/20* (2006.01)
*G01R 19/20* (2006.01)

(52) U.S. Cl. ..................................... 324/117 R
(58) Field of Classification Search .......................... None
See application file for complete search history.

(56) References Cited

U.S. PATENT DOCUMENTS

| | | | |
|---|---|---|---|
| 4,749,939 A | 6/1988 | Seitz | |
| 5,561,368 A * | 10/1996 | Dovek et al. | 324/252 |
| 5,719,494 A * | 2/1998 | Dettmann et al. | 324/117 R |
| 5,933,003 A | 8/1999 | Hebing et al. | |
| 6,150,809 A * | 11/2000 | Tiernan et al. | 324/238 |
| 6,184,679 B1 * | 2/2001 | Popovic et al. | 324/251 |
| 6,400,130 B2 * | 6/2002 | Berkcan et al. | 324/127 |
| 6,965,229 B2 * | 11/2005 | Duan et al. | 324/210 |
| 7,016,163 B2 * | 3/2006 | Wan et al. | 360/324.1 |
| 7,737,678 B2 * | 6/2010 | Shoji | 324/117 R |

FOREIGN PATENT DOCUMENTS

| | | |
|---|---|---|
| JP | A 05-322934 | 12/1993 |
| JP | B2 07-123090 | 12/1995 |
| JP | A 10-070325 | 3/1998 |
| JP | A 10-506193 | 6/1998 |
| JP | A 2002-202326 | 7/2002 |
| JP | A 2005-236134 | 9/2005 |
| WO | WO 2004/072672 A1 | 8/2004 |

* cited by examiner

*Primary Examiner* — Ha Tran T Nguyen
*Assistant Examiner* — Roberto Velez
(74) *Attorney, Agent, or Firm* — Oliff & Berridge, PLC

(57) ABSTRACT

The present invention provides a current sensor of smaller and simpler configuration, capable of measuring a current to be detected with high precision and stability. A current sensor has a V-shaped conductor line and a pair of magnetoresistive elements disposed along with the conductor line so that a resistance value of one of the magnetoresistive elements changes in a direction opposite to that of resistance-value-change of the other magnetoresistive element according to current magnetic fields produced by a current to be detected flowing through the conductor line.

6 Claims, 15 Drawing Sheets

CURRENT SENSOR

BACKGROUND OF THE INVENTION

1. Field of the Invention

The present invention relates to a current sensor having a conductor line that generates a current magnetic field when current flows, capable of detecting a change in the current with high sensitivity.

2. Description of the Related Art

In measuring correctly a control current which flows into a circuit of control equipment, a method where resistances are connected in series within the circuit to measure a voltage drop of the resistances is applied. In this case, however, a load different from the control system is applied, and there is a possibility that an adverse influence may be exerted on the control system. Consequently, a method of indirectly measuring the control current by detecting the gradient of a current magnetic field generated by the control current has been used. Specifically, a control current is supplied to a U-shaped, curved conductor line, and variation of current magnetic fields produced around the curved conductor line is detected by use of a Hall device (for example, refer to Japanese Unexamined Patent Publication No. H12-123090).

However, the above-described current sensor has problems that a miniaturization is difficult and that the linearity of detection sensitivity to the change in magnetic field or high-frequency response are inadequate and so on. For this reason, a current sensor, in which a giant magnetoresistive element developing a Giant Magneto-Resistive effect (hereinafter referred to as GMR element) is arranged in a current magnetic field generated by the control current instead of the Hall element in order to detect its gradient, is proposed. The current sensor using such a GMR element can improve the detection sensitivity and high-frequency response, and what is more, a detection characteristic that is stabilized against a temperature change is obtainable.

SUMMARY OF THE INVENTION

In these days, the current sensor capable of detecting current more precisely and having a still compact whole configuration is called for strongly. However, a further miniaturization is difficult for the above-described current sensor in which the GMR element is arranged around the curved (U-shaped) conductor line.

The present invention has been achieved in consideration of such problem, and an object of the present invention is to provide a more miniaturized current sensor capable of measuring current to be detected with high precision and stability.

According to an embodiment of the present invention, there is provided a first current sensor including a V-shaped conductor line, and a pair of magnetoresistive elements disposed along with the conductor line so that a resistance value of one of the magnetoresistive elements changes in a direction opposite to that of resistance-value-change of the other magnetoresistive element according to current magnetic fields produced by a current to be detected flowing through the conductor line. In this case, it is preferred to arrange one of the magnetoresistive elements on one of a pair of arms forming the V-shape in the conductor line, and arrange the other magnetoresistive element on the other arm.

In the first current sensor of an embodiment of the present invention, since the pair of magnetoresistive elements are disposed along with the V-shaped conductor line, an interaction of the current magnetic fields is reduced compared with a case where the magnetoresistive elements are arranged respectively on a pair of parallel portions of a U-shaped curved conductor line. For this reason, even if a distance between the magnetoresistive elements is reduced, the current magnetic fields applied to each magnetoresistive element can develop a sufficient intensity to be detectable. Moreover, a dimension of the folded portion in the conductor line becomes relatively small. Since a resistance value of one of the magnetoresistive elements changes in a direction opposite to that of resistance-value-change of the other magnetoresistive element according to the current magnetic field produced by the current to be detected flowing through the conductor line, the current to be detected can be measured based on a difference in voltage drops produced when constant current is supplied to the pair of magnetoresistive elements.

According to an embodiment of the present invention, there is provided a second current sensor including a straight-line conductor line, and a pair of magnetoresistive elements disposed along with the conductor line so that a resistance value of one of the magnetoresistive elements changes in a direction opposite to that of resistance-value-change of the other magnetoresistive element according to a current magnetic field produced by a current to be detected flowing through the conductor line.

In the second current sensor of an embodiment of the present invention, since the pair of magnetoresistive elements are disposed along with the straight-line conductor line, an interaction of the current magnetic fields is reduced compared with a case where magnetoresistive elements are arranged on a pair of parallel portions of a U-shaped curved conductor line respectively. For this reason, even if a distance between the magnetoresistive elements is more reduced, the intensity of the current magnetic fields applied to each magnetoresistive elements becomes sufficient to be detectable. Moreover, since the straight-line conductor line has no folded portion like the U-shaped curved conductor line, two-dimensional spread is controlled. What is more, since resistance value of one of magnetoresistive elements changes in a direction opposite to that of resistance-value-change of the other magnetoresistive element according to the current magnetic field produced by a current to be detected flowing into the conductor line, measurement of the current to be detected is possible based on a difference in voltage drops at the time of supplying constant current to the pair of magnetoresistive elements.

In the first and second current sensors of an embodiment of the present invention, a magnetoresistive element preferably includes a pinned layer having a magnetization direction pinned to a direction, a free layer whose magnetization direction changes according to an external magnetic field, while the magnetization direction under no external magnetic field is parallel or antiparallel to the direction in which the conductor line is extending, and an intermediate layer inserted between the pinned layer and the free layer. It is desirable that the magnetization direction of the pinned layer is orthogonal to or parallel to the magnetization direction of the free layer under no external magnetic field. In the mutually orthogonal case, it is preferred to apply a bias magnetic field having the same direction as the magnetization direction of the free layer under no external magnetic field by a bias applying means. On the other hand, in the mutually parallel case, it is desirable to apply a bias magnetic field which has a parallel component parallel to the magnetization direction of the pinned layer and an orthogonal component orthogonal to the parallel component by the bias applying means. An example of the bias applying means include a magnetic sheet attached on one side of the magnetoresistive element. Examples of the external magnetic field here include the current magnetic field generated by the current to be detected, the bias magnetic field applied by the bias applying means or an external noise.

Preferably, the first and second current sensors of an embodiment of the present invention further include a pair of constant current sources each supplying a constant current of a common magnitude to each of the magnetoresistive elements, and a difference detector detecting difference in voltage drops resulting from the constant current in each of the magnetoresistive element.

According to an embodiment of the present invention, there is provided a third current sensor including a V-shaped conductor line generating current magnetic fields according to a supplied current to be detected, and first through fourth magnetoresistive elements disposed along with the conductor line so that resistance value of each of the magnetoresistive elements changes according to the current magnetic field. One end of the first magnetoresistive element and one end of the second magnetoresistive element are connected each other in a first junction point, one end of the third magnetoresistive element and one end of the fourth magnetoresistive element are connected each other in a second junction point, the other end of the first magnetoresistive element and the other end of the fourth magnetoresistive element are connected each other in a third junction point, and the other end of the second magnetoresistive element and the other end of the third magnetoresistive element are connected each other in a fourth junction point, thereby configuring a bridge circuit. In this case, it is preferred to arrange the first and the third magnetoresistive elements on one of a pair of arms forming the V-shape in the conductor line, while arrange the second and the fourth magnetoresistive elements on the other arm forming the V-shape of the conductor line symmetrically to the arrangement of the first and the third magnetoresistive elements.

In the third current sensor of an embodiment of the present invention, since four magnetoresistive elements are disposed along with the V-shaped conductor line, an interaction between the current magnetic fields of the parallel portions produced in a U-shaped curved conductor line can be avoided, and consequently, a distance between the magnetoresistive elements can be reduced. Moreover, dimension of the folded portion in the conductor line can be made relatively small. In addition, since the magnetoresistive elements configure a bridge circuit, a current to be detected can be measured by outputs from the third and fourth junction points when applying voltage between the first junction point and the second junction point, for example.

According to an embodiment of the present invention, there is provided a fourth current sensor including a straight-line conductor line generating a current magnetic field according to a supplied current to be detected, and first through fourth magnetoresistive elements disposed along with the conductor line so that resistance value of each of the magnetoresistive elements changes according to the current magnetic field. One end of the first magnetoresistive element and one end of the second magnetoresistive element are connected each other in a first junction point, one end of the third magnetoresistive element and the fourth magnetoresistive element are connected each other in a second junction point, the other end of the first magnetoresistive element and the other end of the fourth magnetoresistive element are connected each other in a third junction point, and the other end of the second magnetoresistive element and the other end of the third magnetoresistive element are connected each other in a fourth junction point, thereby configuring a bridge circuit.

In the fourth current sensor of an embodiment of the present invention, since the four magnetoresistive elements are disposed along with the straight-line conductor line, an interaction between the current magnetic fields of the parallel portions produced in a U-shaped curved conductor line is avoided, and consequently, a distance between the magnetoresistive elements can be reduced. Moreover, since the straight-line conductor line has no folded portion like the U-shaped curved conductor line, two-dimensional spread is controlled. Still more, since the magnetoresistive elements configure a bridge circuit, a current to be detected can be measured by outputs from the third and fourth junction points when applying voltage between the first junction point and the second junction point, for example.

According to the first or third current sensors of an embodiment of the present invention, a conductor line is formed of a V-shaped configuration, and a pair of magnetoresistive elements (or a first through fourth magnetoresistive elements) are disposed along with the conductor line. As a result, even in the case where a distance of the magnetoresistive elements is reduced, current magnetic fields having sufficient intensity for a detectable grade can be given to each magnetoresistive element compared with a case where magnetoresistive elements are arranged on a pair of parallel portions in a U-shaped curved conductor line, respectively. In addition, since dimension for the folded portion can also be made small, dimension of the conductor line can be made small accordingly. Namely, more compact entire configuration is realizable while maintaining the dimension of the magnetoresistive elements. Thereby, a measurement error caused by temperature differences between the magnetoresistive elements can be reduced, consequently capable of realizing a current measurement with more precision and stability.

According to the second or fourth current sensor of an embodiment of the present invention, a conductor line is formed of a straight-line configuration, and a pair of magnetoresistive elements (or first through fourth magnetoresistive elements) are disposed along with the conductor line. As a result, even in the case where a distance of the magnetoresistive elements is reduced, current magnetic field having sufficient intensity for a detectable grade can be given to each magnetoresistive element compared with a case where magnetoresistive elements are arranged on a pair of parallel portions in a U-shaped curved conductor line, respectively. Since the straight-line conductor lines have no folded portion as the U-shaped conductor line, dimension of the conductor line can be made small accordingly. Namely, more compact entire configuration is realizable while maintaining the dimension of the magnetoresistive elements. Thereby, a measurement error caused by temperature differences between the magnetoresistive elements can be reduced, consequently capable of realizing a current measurement with more precision and stability.

Other and further objects, features and advantages of the invention will appear more fully from the following description.

DETAILED DESCRIPTION OF THE PREFERRED EMBODIMENTS

Embodiments of the present invention will be described in detail hereinbelow with reference to the drawings.

First Embodiment

Figure 1:
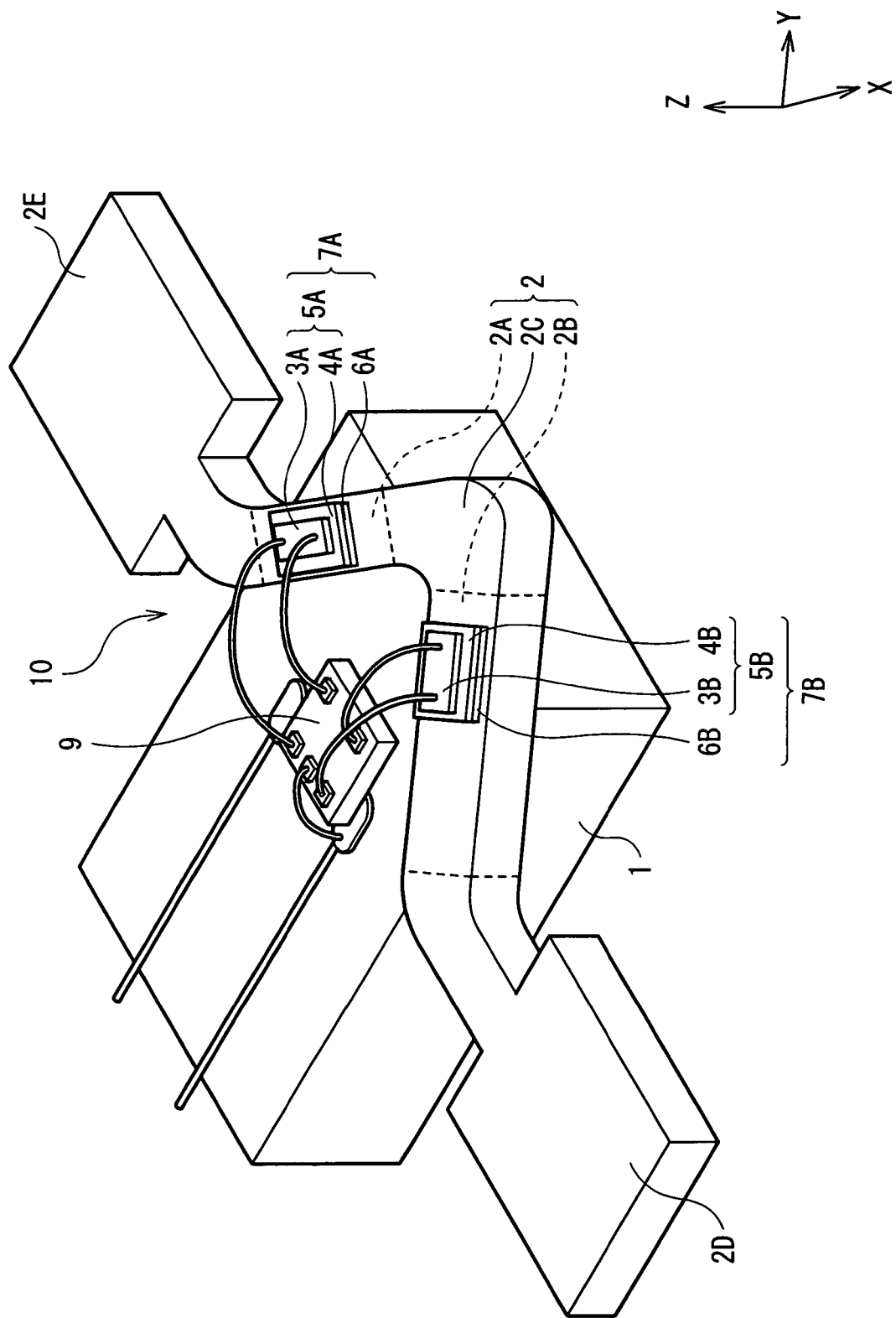
FIG. 1 is a perspective view showing a configuration of a current sensor according to a first embodiment in the present invention.

First, a configuration of a current sensor according to a first embodiment in the present invention will be explained with reference to FIG. 1 and FIG. 2. FIG. 1 is a schematic diagram showing a perspective configuration of a current sensor 10 according to the present embodiment, and FIG. 2 expresses a circuit configuration of the current sensor 10 appearing in FIG. 1. Directions of all the arrows representing a current to be detected Im, a compensating current Id, current magnetic fields HmA and HmB, compensating current magnetic fields Hd, bias magnetic fields Hb1 and Hb2, and a current I0 indicate a relative direction with respect to a first and a second magnetoresistive elements 3A and 3B (which will be described later) in FIG. 2.

The current sensor 10 is an ammeter for measuring the current to be detected Im supplied to a conductor line 2 formed on a substrate 1, and is provided with magnetic sensors 7A and 7B including the first and the second magnetoresistive elements 3A and 3B (hereinafter just referred to as MR elements 3A and 3B.). The MR elements 3A and 3B are connected each other at a first junction point P1, and arranged symmetrically with respect to a central line CL passing along the midpoint on a virtual straight-line connecting the MR elements 3A and 3B each other (refer to FIG. 2).

The conductor line 2 has a V-shaped figure in plan view, including a pair of straight-line portions (as a pair of arms) 2A and 2B and a folded portion 2C for connecting these straight-line portions 2A and 2B. The ends of the conductor line 2 are connected to pads 2D and 2E, respectively. The straight-line portions 2A and 2B are arranged axisymmetrically with respect to the central line CL (symmetry axis) in a plane parallel to the plane including the MR elements 3A and 3B, and they are extending with an angle of, for example, 45 degrees (that is, orthogonal to each other), in the x-axis direction and in the y-axis direction, respectively. On the straight-line portions 2A and 2B are provided the magnetic sensors 7A and 7B, respectively. Details of the magnetic sensors 7A and 7B will be described later.

As for the straight-line portions 2A and 2B, the areas of cross sections thereof orthogonal to the extending directions are uniform and equal to each other. Thereby, synthetic magnetic fields Hm1 and Hm2 of current magnetic field HmA and current magnetic field HmB generated when the current to be detected Im flows into the conductor line 2 from the pad 2D toward the pad 2E, for example, will be respectively applied to the MR elements 3A and 3B in the directions shown by arrows in FIG. 2. Here, the current magnetic field HmA is generated in the +Y direction in the straight-line portion 2A, and the current magnetic fields HmB is generated in the +X direction in the straight-line portion 2B. Since the current magnetic fields HmA and HmB, although having different directions mutually, are generated by the same current to be detected Im and the areas of the cross sections of the straight-line portions 2A and 2B are equal and uniform to each other, the intensity (absolute value) of the current magnetic fields HmA and HmB are equal to each other. However, since the MR element 3A is arranged close to the straight-line portion 2A, the influence of the current magnetic fields HmB is smaller than the influence of the current magnetic fields HmA. For this reason, the direction of the synthetic magnetic field Hm1 applied to the MR element 3A is slightly tilted (rotated) from the +Y direction to the +X direction, that is, a Y2 direction. Similarly, since the MR element 3B is arranged close to the straight-line portion 2B, the influence of the current magnetic fields HmA is small. For this reason, the direction of the synthetic magnetic field Hm2 applied to the MR element 3B is slightly tilted (roated) from the +X direction to the +Y direction, that is, an X2 direction. Furthermore, the distance from the straight-line portion 2A to the MR element 3A and the distance from the straight-line portion 2B to the MR element 3B are mutually equal, while the distance from the straight-line portion 2A to the MR element 3B and the distance from the straight-line portion 2B to the MR element 3A are mutually equal. As a result of that, the intensity (absolute value) of the synthetic magnetic field Hm1 applied to the MR element 3A and the intensity (absolute value) of the synthetic magnetic field Hm2 applied to the MR element 3B are mutually equal. The MR elements 3A and 3B are constituted so that each resistance R1 and R2 (which will be described later) can develop an opposite directional change each other by the existence of synthetic magnetic fields Hm1 and Hm2 when the current sensor 10 is driven.

The magnetic sensors 7A and 7B are respectively stuck on the straight-line portions 2A and 2B with an adhesive layer having, for example, 5 μm-10 μm thick (not shown) in between. More specifically, the magnetic sensors 7A and 7B are formed by laminating magnetic sheets 6A and 6B and element substrates 5A and 5B in order on the straight-line portions 2A and 2B, respectively, as appearing in FIG. 1. An adhesive layer with a thickness of, for example, 5 μm-10 μm (not shown) is provided between the magnetic sheets 6A and 6B and the element substrates 5A and 5B. The element substrates 5A and 5B have a structure in which the MR elements 3A and 3B are provided on substrates 4A and 4B made of a silicon wafer of the order of 100 μm thick, respectively. The magnetic sheets 6A and 6B apply bias magnetic fields Hb1 and Hb2 (refer to FIG. 2) to the MR elements 3A and 3B, respectively. Here, the direction of the bias magnetic field Hb1 is an X3 direction (direction tilted slightly from the +X direction to the −Y direction) which intersects perpendicularly with the −Y2 direction, and the direction of the bias magnetic field Hb2 is a Y3 direction (direction tilted slightly from the +Y direction to the −X direction) which intersects perpendicularly with the X2 direction. It is to be noted that the directions of the bias magnetic fields Hb1 and Hb2 are determined with reference to the magnetization directions of each pinned layer 13 (which will be described later) of the MR elements 3A and 3B besides the synthetic magnetic fields Hm1 and Hm2. The magnetic sheets 6A and 6B are made of a barium strontium ferrite [(Ba—Sr) $Fe_2O_4$], for example, and have a thickness of 75 μm-95 μm. It is to be noted that the material for the magnetic sheets 6A and 6B is not limited to that, but other ferromagnetic materials which can serve as a permanent magnet can also be used. It is preferred that the magnetic sheets 6A and 6B have a larger area than the MR elements 3A and 3B so that application of the bias magnetic fields Hb1 and Hb2 can be stabilized.

Figure 2:
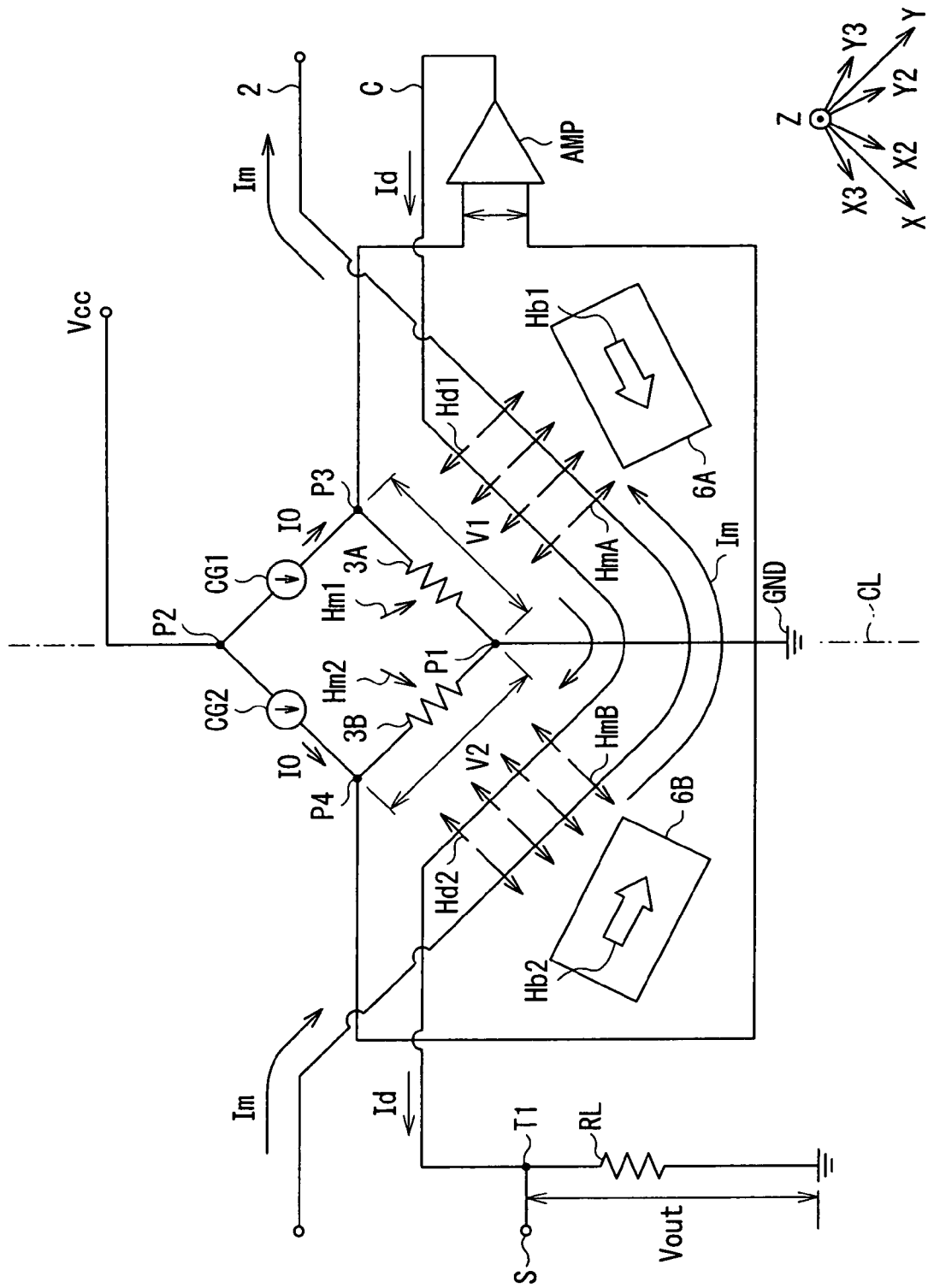
FIG. 2 is a circuit diagram corresponding to the current sensor appearing in FIG. 1.

The current sensor 10 further includes a constant current source CG1 (a first constant current source) and a constant current source CG2 (a second constant current source), the ends of which are connected each other in a second junction point P2 (FIG. 2). The constant current source CG1 is connected to the MR element 3A by one end opposite to the first junction point P1 in a third junction point P3, and the constant current source CG2 is connected to the MR element 3B by one end opposite to the first junction point P1 in a fourth junction point P4. Namely, the MR element 3A and the constant current source CG1 are connected in series, and the MR element 3B and the constant current source CG2 are connected in series, while both of the series connections are connected in parallel with each other axisymmetrically with respect to the central line CL (symmetry axis). Here, the constant current source CG1 and the constant current source CG2 are constituted so as to supply a constant current I0 of the equal value to the MR element 3A and the MR element 3B, respectively. It is to be noted that the constant current sources CG1 and CG2 are arranged in the inside of a circuit board 9 provided on the substrate 1 (not shown in FIG. 1).

The current sensor 10 is further provided with a compensating current line C as shown in FIG. 2. If voltage is applied between the first junction point P1 and the second junction point P2, a compensating current Id based on the potential difference between the third junction point P3 and the fourth junction point P4 will be supplied to the compensating current line C (FIG. 2). One end of the compensating current line C is connected to the output side of a differential amplifier AMP as a difference detector whose input side is connected to the third and fourth junction points P3 and P4, and the other end of the compensating current line C is grounded via a resistor RL. A compensating current detector S is connected to the resistor RL at a junction point T1 on the differential amplifier AMP side. Here, the compensating current line C is arranged so that compensating current magnetic field Hd1 and Hd2, which are opposite to the current magnetic fields Hm1 and Hm2 respectively is generated when the compensating current Id flows. Namely, the compensating current magnetic field Hd1 is generated in the −Y direction, while the compensating current magnetic field Hd2 is generated in the −X direction, consequently having an effect of canceling out the current magnetic fields Hm1 and Hm2, respectively.

Figure 3:
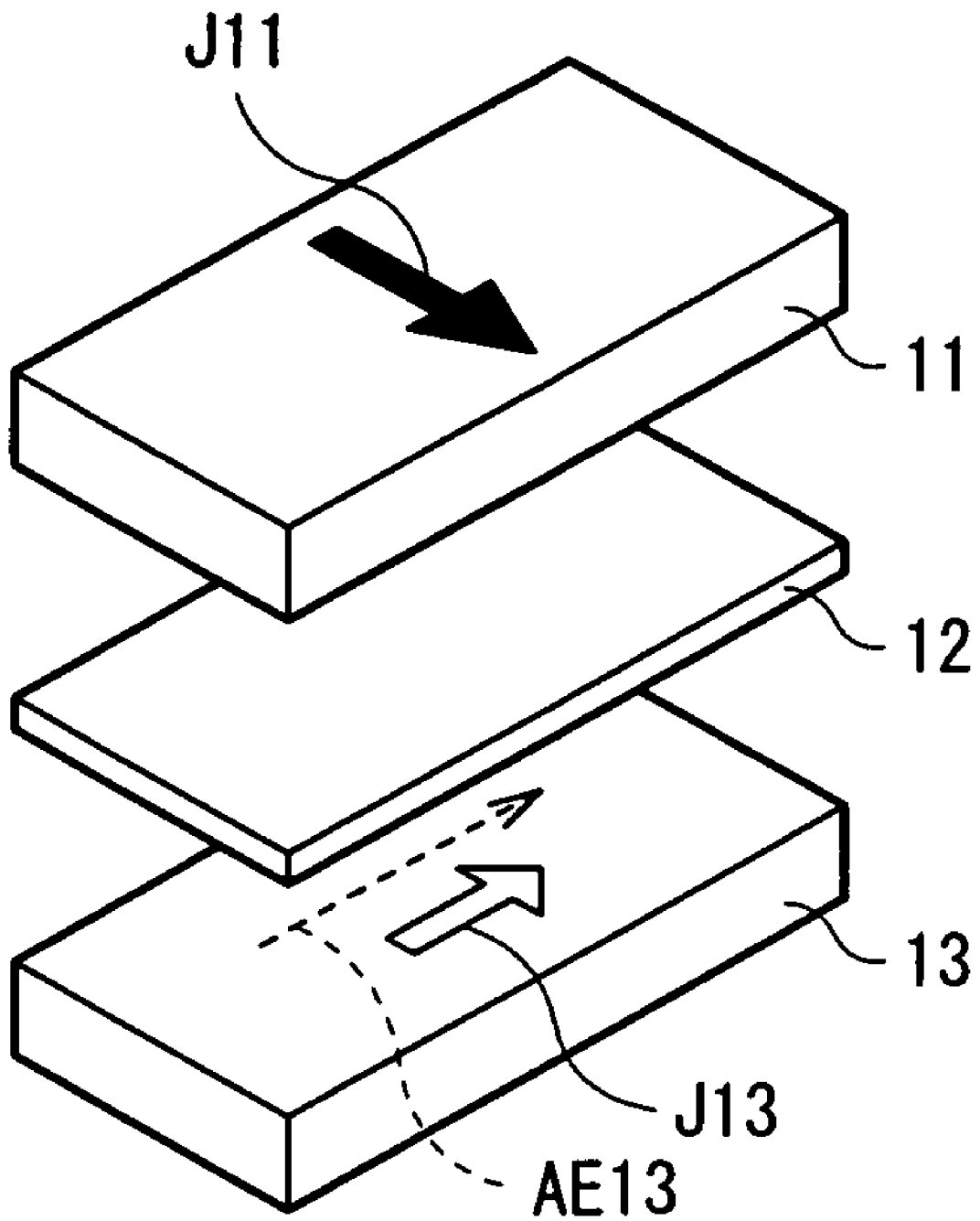
FIG. 3 is an exploded perspective view showing the configuration of a magnetoresistive element which is the principal part of the current sensor appearing in FIG. 1.

The MR elements 3A and 3B are constituted by laminating an insulating film, a giant magnetoresistive (GMR) film developing a Giant Magneto-Resistive effect, an insulating film, and a pad are laminated in order on the substrates 4A and 4B, respectively. Here, the insulating film is made of aluminum oxide ($Al_2O_3$) etc., for example. The pad is an electrode for supplying a sense current in reading a resistance change of the GMR film. The GMR film will be explained in more detail with reference to FIG. 3. FIG. 3 is an exploded perspective view disassembling and showing the configuration of the GMR films in MR elements 3A and 3B.

As shown in FIG. 3, the GMR films in the MR elements 3A and 3B have a spin valve structure in which a plurality of function films including magnetic layers are laminated. Specifically, the GMR film includes: a pinned layer 11 having a magnetization direction J11 pinned to a certain direction; an intermediate layer 12 exhibiting no specific magnetization directions; and a free layer 13 having a magnetization direction J13 whose direction is changed according to external magnetic fields H including the synthetic magnetic fields Hm1 and Hm2, in order. It is to be noted that FIG. 3 shows an unloaded condition (namely, the external magnetic field H is in the state of zero) in which the synthetic magnetic fields Hm1 and Hm2 are zero (Hm1 and Hm=0), and the bias magnetic fields Hb1 and Hb2 generated by the magnetic sheets 6A, 6B are not applied. In this case, the magnetization direction J13 of the free layer 13 are in parallel with its own easy magnetization direction AE13, while it is orthogonal to the magnetization direction J11 of the pinned layer 11.

The free layer 13 is made of a soft magnetic material such as nickel iron alloy (NiFe). The intermediate layer 12 is made of copper (Cu), its top face being in contact with the pinned layer 11, its under face being in contact with the free layer 13. The intermediate layer 12 may be made of, besides copper, a nonmagnetic metal having high conductivity such as gold (Au). Each of the top face of the pinned layer 11 (the face on the side opposite to the intermediate layer 12) and the under face of the free layer 13 (the face on the side opposite to the intermediate layer 12) is protected with a protection film (not shown). An exchange bias magnetic field Hin in the magnetization direction J11 is generated between the pinned layer 11 and the free layer 13, working on each other with the intermediate layer 12 in between. The intensity of the exchange bias magnetic field Hin changes as the spin direction in the free layer 13 rotates according to the interval between the pinned layer 11 and the free layer 13 (that is, the thickness of the intermediate layer 12). Although FIG. 3 shows one example of configuration in which the free layer 13, the intermediate layer 12, and the pinned layer 11 are laminated in order from bottom up, it is not limited to this but may be made in a configuration of laminating in the opposite order.

In the GMR films of the MR elements 3A and 3B having the foregoing structures, the magnetization direction J13 of the free layer 13 rotates by applying the synthetic magnetic fields Hm1 and Hm2, and consequently the relative angle of the magnetization direction J13 and the magnetization direction J11 will be changed. The relative angle is determined by the magnitude and direction of the synthetic magnetic fields Hm1 and Hm2.

Figure 4A:
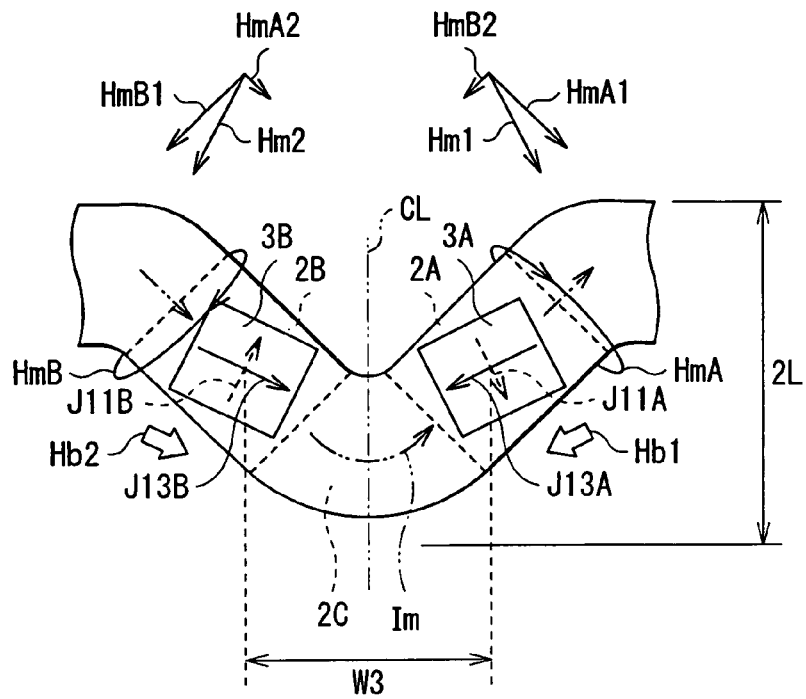
FIGS. 4A and 4B are conceptual diagrams for explaining a state of magnetization directions, current magnetic fields and bias magnetic fields in the current sensor appearing in FIG. 1.
Figure 4B:
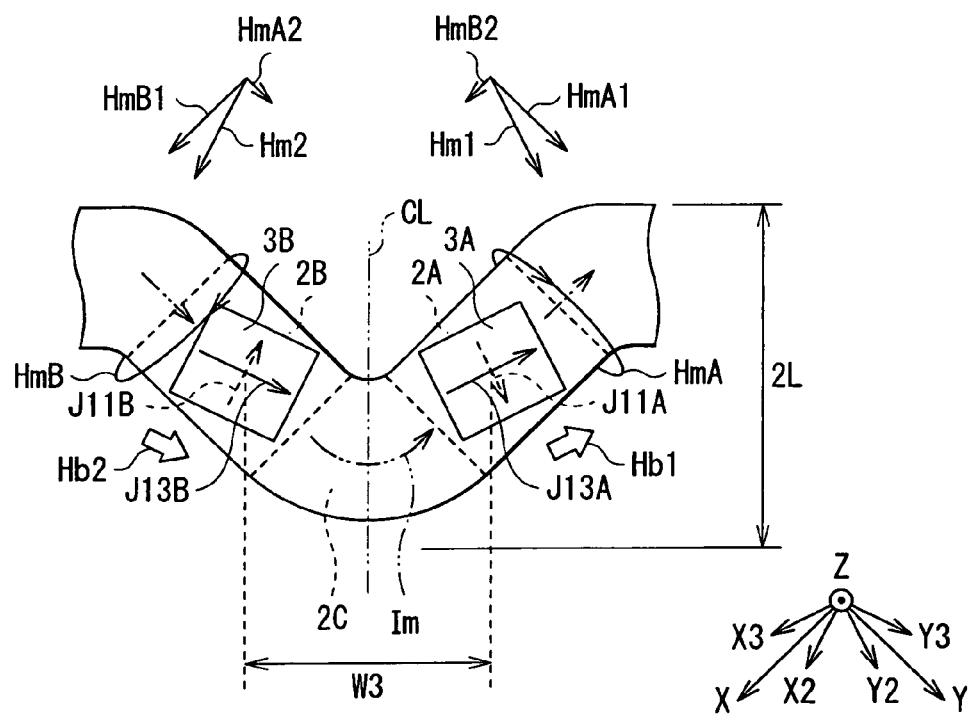

A relation among the magnetization directions J11 and J13 of the GMR films, the bias magnetic fields Hb1 and Hb2, and the synthetic magnetic fields Hm1 and Hm2 will be explained herein with reference to FIGS. 4A and 4B. FIGS. 4A and 4B are conceptual diagrams showing the relation among the current directions, the magnetic field directions, and the magnetization directions in the current sensor 10. For example, suppose that the current to be detected Im flows as shown by the arrow along the extending direction of the conductor line 2, the current magnetic field HmA is generated around the straight-line portion 2A, and the current magnetic field HmB is generated around the straight-line portion 2B. In this case, the synthetic magnetic field Hm1 applied to the MR element 3A is a resultant force of a magnetic field component HmA1 in the +Y direction caused by the current magnetic field HmA and a magnetic field component HmB2 in the +X direction caused by the current magnetic field HmB, as shown by vectors. On the other hand, the synthetic magnetic field Hm2 applied to the MR element 3B is a resultant force of a magnetic field component HmA2 in the +Y direction caused by the current magnetic field HmA and a magnetic field component HmB1 in the +X direction caused by the current magnetic field HmB, as shown by vectors. Here, in the MR elements 3A and 3B, the magnetization directions J11A and J11B of the pinned layers 11 are pinned in the direction parallel or antiparallel with the synthetic magnetic fields Hm1 and Hm2, respectively. When no external magnetic field H is applied, magnetization directions J13A and J13B of the free layers 13 are in a state orthogonal to the synthetic magnetic fields Hm1 and Hm2, respectively. Namely, when no external magnetic field H is applied, the magnetization directions J13A and J13B are in a state orthogonal to the magnetization directions J11A and J11B, respectively. Therefore, when the current to be detected Im is supplied to the conductor line 2 and the synthetic magnetic fields Hm1 and Hm2 are generated, the magnetization directions J13A and J13B are coming to be in parallel (low resistance), or antiparallel (high resistance) with the magnetization directions J11A and J11B, more and more. The MR element 3A and the MR element 3B are set up so that their own resistances R1 and R2 may change oppositely each other according to the synthetic magnetic fields Hm1 and Hm2. Specifically, as shown in FIG. 4A, in the MR element 3A, the magnetization direction J11A is in the +Y2 direction while the magnetization direction J13A in the case no external magnetic field H is applied is in the +X3 direction, for example. On the other hand, in the MR element 3B, the magnetization direction J11B is in the −X2 direction while the magnetization direction J13B in the case no external magnetic field H is applied is in the +Y3 direction. In this case, when the current to be detected Im flows in the direction of the arrow to generate the synthetic magnetic fields Hm1 and Hm2, the magnetization direction J13A rotates counter-clockwise (on the drawing sheet) to come to be in parallel with the magnetization direction J11A while the magnetization direction J13B rotates clockwise (on the drawing sheet) to come to be in antiparallel with the magnetization direction J11B. As a result, the resistance R1 of the MR element 3A decreases, and the resistance R2 of the MR element 3B increases. Or it is also possible that, as shown in FIG. 4B, in the MR element 3A, the magnetization direction J11A is set in the +Y2 direction and the magnetization direction J13A in the case no external magnetic field H is applied is set in the −X3 direction, while in the MR element 3B, the magnetization direction J11B is set in the −X2 direction and the magnetization direction J13B in the case no external magnetic field H is applied is set in the +Y3 direction. In this case, when the current to be detected Im flows in the direction indicated by the arrow to generate the synthetic magnetic fields Hm1 and Hm2, the magnetization direction J13A rotates clockwise to come to be in parallel with the magnetization direction J11A, while the magnetization directions J13B rotates clockwise to be in antiparallel with the magnetization direction J11B. As a result, the resistance R1 of the MR element 3A also decreases, and the resistance R2 of the MR element 3B also increases. Although it is constituted in such a way that the resistance R1 of the MR element 3A decreases and the resistance R2 of the MR element 3B increases in both cases in FIGS. 4A and 4B, it is not limited to that, and it is also possible to have such a configuration that the resistance R1 increases and the resistance R2 decreases.

In both of FIG. 4A and FIG. 4B, it is to be noted that the magnetic sheets 6A and 6B are set up so as to apply bias magnetic fields Hb1 and Hb2 having the same direction as the magnetization-directions J13A and J13B in the case of the external magnetic field H being zero. Therefore, the bias magnetic fields Hb1 and Hb2, which are corresponding to an anisotropic magnetic field, strengthen the uniaxial anisotropy of the free layer 13 to contribute to stabilization of the magnetic field detecting operation in the MR elements 3A and 3B. In related arts, shape anisotropy has been increased by way of developing the shape of the MR element itself long and slender, and further, a resistance change ratio has been raised by way of arranging two or more of the MR elements with a predetermined gap, respectively. In this manner, however, a comparatively big space is required and furthermore a compensating current line has to be enlarged. On the other hand, according to the current sensor 10 of the present embodiment, the flexibility of the shape of the MR elements 3A and 3B is high because shape anisotropy is not used, and there is no need of dividing each elements into two or more. As a result, a more compact configuration has been realized.

Figure 21:
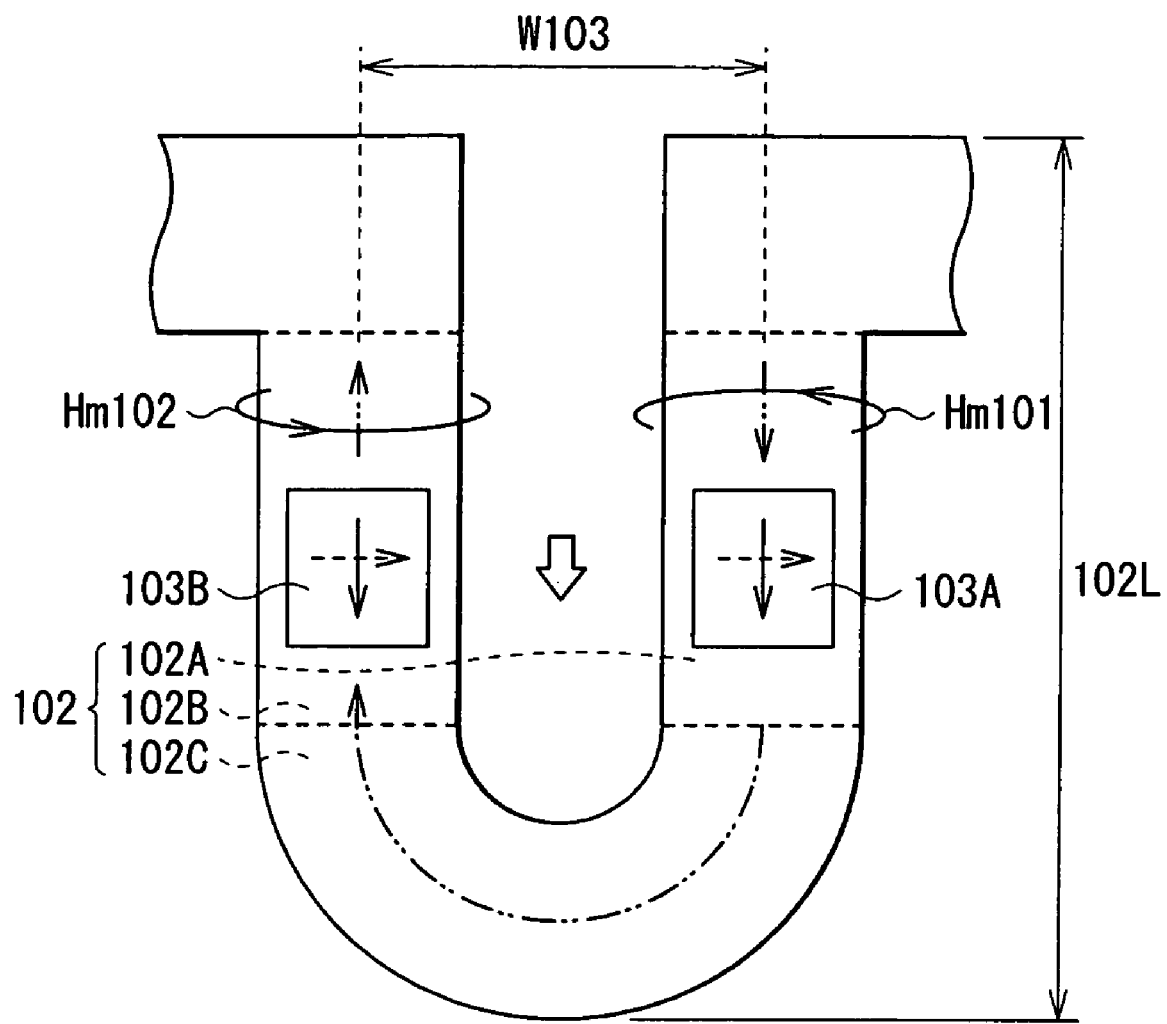
FIG. 21 is a schematic diagram showing a configuration of the conductor line in a current sensor of related arts.

What is more, in the current sensor 10, the conductor line 2 is formed of a V-shaped configuration including the straight-line portion 2A and the straight-line portion 2B that are orthogonal to each other. In this manner, current measurement can be conducted more precisely, and what is more, miniaturization of the entire configuration can be realized compared with a current sensor of related arts in which a U-shaped conductor line 102 including a pair of parallel straight-line portions 102A and 102B as shown in FIG. 21 is used. That is to say, in the case of the U-shaped conductor line 102, an interaction occurs between a current-magnetic-field Hm101 and a current-magnetic-field Hm102 to cancel each other when the straight-line portion 102A and the straight-line portion 102B are disposed closer, since the flowing direction of the current to be detected Im is inevitably made opposite between the straight-line portion 102A and the straight-line portion 102B. In order to reduce such an interaction, it is preferred to maintain a gap W103 of the MR elements 103A and the 103B beyond a certain distance. The conductor line 102 further has a problem that the dimension of a folded portion 102C tends to become large. On the contrary, in the case of the current sensor 10 of the present embodiment, the direction of the current to be detected Im flowing in parallel through each of the straight-line portion 2A and the straight-line portion 2B is not completely antiparallel with each other (in this case, an angle of 45 degrees exists). As a result, the interaction between the current magnetic field Hm1 produced from the straight-line portion 2A and the current magnetic field Hm2 produced from the straight-line portion 2B is relatively weak. For this reason, even when the gap W3 of the MR elements 3A and 3B is made small, the current magnetic fields Hm1 and Hm2 having a sufficient intensity for detecting operation of magnitude can be applied to each of the MR elements 3A and 3B. Thereby, more precise current measurement becomes possible. Further, since the dimension for the folded portion 2C can also be made relatively small, height 2L of the whole conductor line 2 can be made smaller than height 102L of the conductor line 102. Namely, the current sensor 10 having a more compact whole configuration can be realized while maintaining the dimension of the MR elements 3A and 3B.

Thereby, the measurement error caused by the difference of temperature between the MR elements 3A and 3B can also be reduced and more precise and stable current measurement can be possible.

In the current sensor 10 having such a configuration, when voltage is applied between the first junction point P1 and the second junction point P2, a compensating current Id based on a potential difference V0 (difference of the voltage drops produced in each of the MR elements 3A and 3B) between the third junction point P3 and the fourth junction point P4 flows through the compensating current line C via the differential amplifier AMP (difference detector). The compensating current Id is detected by the compensating current detector S. The differential amplifier AMP has a function of adjusting the compensating current Id so that a value of the difference V0 may be made zero.

Hereafter, a method of measuring the current magnetic fields HmA and MmB generated by the current to be detected Im will be explained with reference to FIG. 2.

In FIG. 2, constant current from the constant current sources CG1 and CG2 at the time of applying a predetermined voltage between the first junction point P1 and the second junction point P2 is indicated as I0, and the resistances of the MR elements 3A and 3B are indicated as R1 and R2, respectively. When the current magnetic fields HmA and HmB are not applied, potential V1 in the third junction point P3 is given by the expression:

$$V1 = I0 \times R1$$

Potential V2 in the fourth junction point P4 is given by the expression:

$$V2 = I0 \times R2$$

Therefore, potential difference between the third junction point P3 and the fourth junction point P4 is given as follows:

$$V0 = V1 - V2 \qquad (1)$$
$$= I0 \times R1 - I0 \times R2$$
$$= I0 \times (R1 - R2)$$

In this circuit, the amount of resistance change can be obtained by measuring the potential difference V0 when the current magnetic field HmA and HmB are applied. For example, when the current magnetic field Hm is applied, supposing that the resistances R1 and R2 increase by variation amounts ΔR1 and ΔR2, respectively, the Equation (1) is rewritten as follows:

$$V0 = V1 - V2 \qquad (2)$$
$$= I0 \times (R1 - R2)$$
$$= I0 \times \{(R1 + \Delta R1) - (R2 + \Delta R2)\}$$

As already stated, since the MR elements 3A and 3B are arranged so that the resistances R1 and R2 show an opposite directional variation each other by the current magnetic fields HmA and HmB, the variation amounts ΔR1 and ΔR2 have an opposite positive/negative sign each other. Therefore, in Equation (2), resistances R1 and R2 (resistance values before application of the current magnetic fields HmA and HmB) cancel out each other while the variation amounts ΔR1 and ΔR2 are maintained as they are.

Supposing that both of the MR elements 3A and 3B have characteristics which are completely identical, that is, letting R1=R2=R and ΔR1=−ΔR2=ΔR, Equation (2) is rewritten as follows:

$$V0 = I0 \times (R1 + \Delta R1 - R2 - \Delta R2) \qquad (3)$$
$$= I0 \times (R + \Delta R - R + \Delta R)$$
$$= I0 \times (2\Delta R)$$

Therefore, if the MR elements 3A and 3B whose relation between an external magnetic field and their resistance variation amounts is already known are used, the intensity of the current magnetic fields HmA and HmB can be measured and the magnitude of current to be detected Im that generates the current magnetic fields HmA and HmB can be estimated. In this case, since sensing is performed using two MR elements 3A and 3B, twice as much resistance variation can be obtained as compared with the case where sensing is performed using either one of the MR element 3A or the MR element 3B independently, which is advantageous for more accurate measurement value. On the other hand, since variations in the characteristics of MR elements and in the connection resistances, etc. can be suppressed compared with a case where sensing is performed by way of a bridge circuit using four MR elements, balance adjustment is made easy even if an MR element with high sensitivity is used. In addition, since the number of the MR elements itself can be reduced, the number of terminals naturally becomes fewer, which is advantageous for space-saving.

In the current sensor 10, a potential V1 detected in the third junction point P3 and a potential V2 detected in the fourth junction point P4 are supplied to the differential amplifier AMP, and the compensating current Id that makes the difference (potential difference V0) zero is outputted. The compensating current Id from the differential amplifier AMP produces a compensating current magnetic field Hd having a direction opposite to the current magnetic field HmA and HmB by flowing near the MR elements 3A and 3B in the direction opposite to the current to be detected Im, thereby canceling errors resulting from variations in the connection resistances in the circuit, in the characteristics of the MR elements 3A and 3B, deviation of temperature distribution, or the disturbance magnetic fields from the outside, etc. As a result, it is possible to get closer to an intensity that is proportional only to the current magnetic fields HmA and HmB. Therefore, by measuring an output voltage Vout and computing the value of the compensating current Id in view of the relation with the known resistor RL in the compensating current detector S, the value of the current magnetic fields HmA and HmB can be calculated with more precision and the magnitude of the current Im to be detected can be estimated with high precision as a result.

Next, the method of manufacturing the current sensor 10 will be explained with reference to FIGS. 5 through 8.

Figure 5:
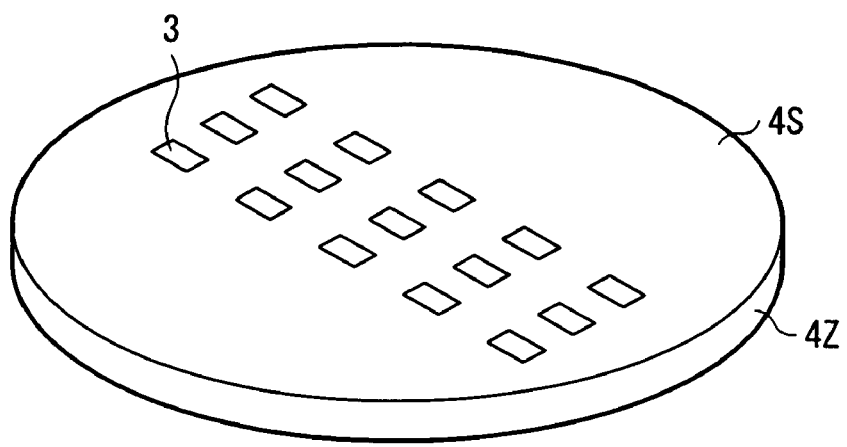
FIG. 5 is a perspective view illustrating one step for explaining a method of manufacturing the current sensor appearing in FIG. 1.
Figure 6:
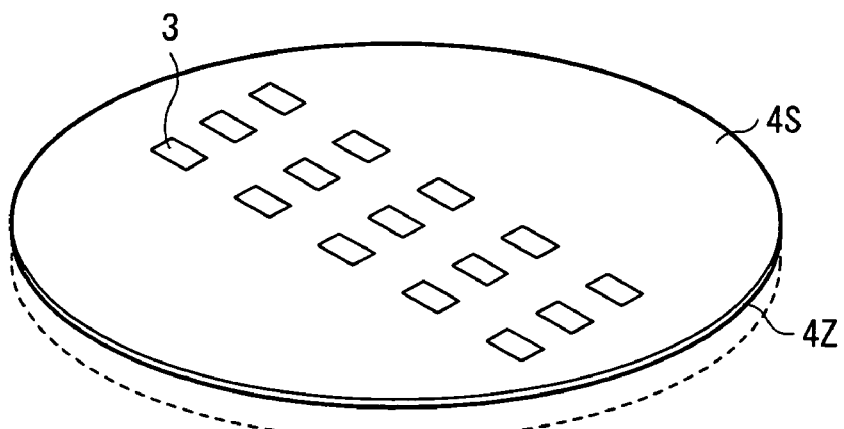
FIG. 6 is a perspective view showing a step following the step of FIG. 5.
Figure 7:
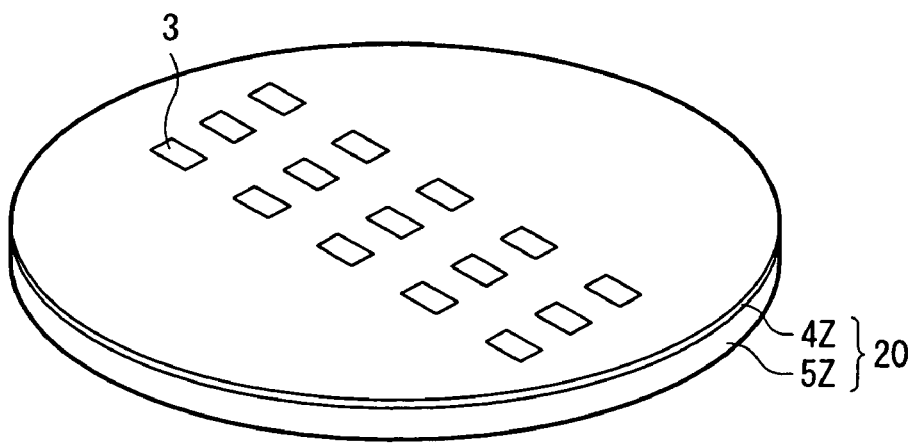
FIG. 7 is a perspective view showing a step following the step of FIG. 6.
Figure 8:
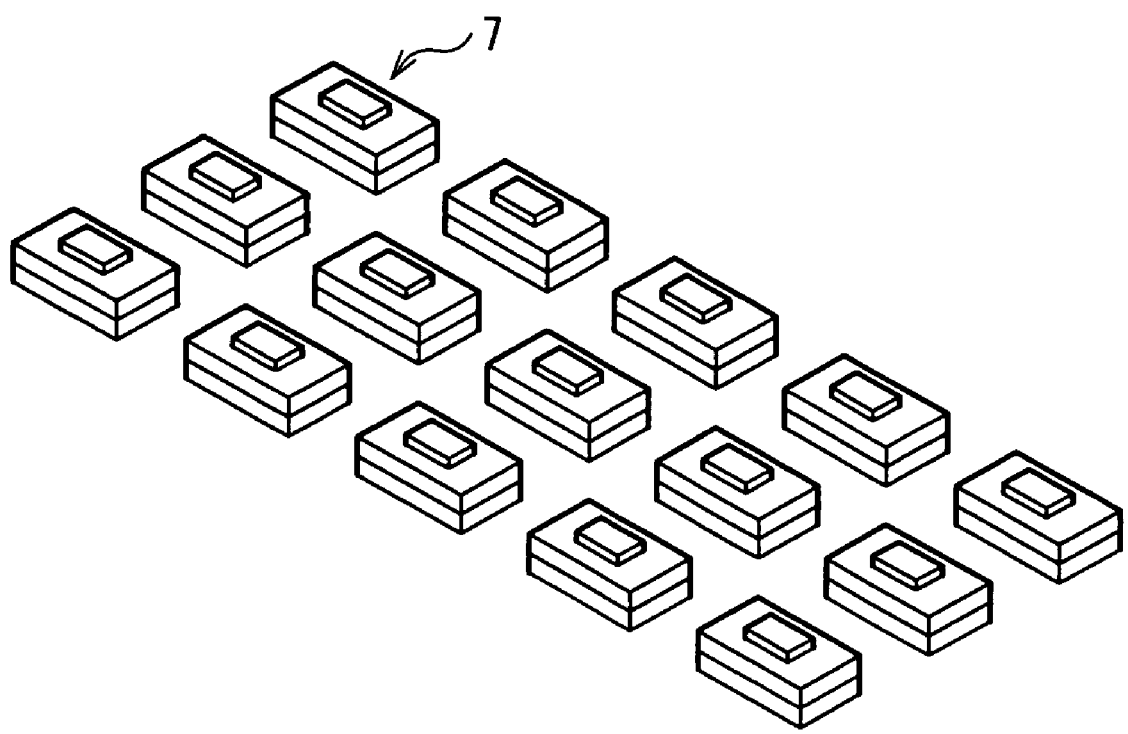
FIG. 8 is a perspective view showing a step following the step of FIG. 7.

Here, first, as shown in FIG. 5, two or more MR elements 3 are formed on a face 4S of a substrate 4Z, such as a silicon wafer having a thickness of the order of 2 mm. The back of the substrate 4Z is then ground until it becomes a thickness of, for example 100 μm as shown in FIG. 6. Then a magnetic sheet 5Z is attached on the back of the substrate 4Z by applying adhesives thereto, for forming a laminated product 20 (FIG. 7). The magnetization direction of the magnetic sheet 5Z is set (magnetizing) under normal temperature and then the magnetic field intensity applied to the MR elements 3 is adjusted by grinding the back of the magnetic sheet 5Z as necessary. Subsequently, as shown in FIG. 8, two or more magnetic sensors 7 are formed by cutting the laminated product 20 to divide into pieces so that each piece include an MR element 3. Finally, two magnetic sensors 7 are provided on a circuit board (not shown) and performing predetermined steps such as arranging the circuit board onto the position corresponding to the straight-line portions 2A and 2B of the conductor line 2, thereby completing the current sensor 10.

As explained above, according to the current sensor 10 of the present embodiment, the MR elements 3A and 3B and magnetic sheets 6A and 6B, which have been disposed along with the conductor line 2 used as the passage of the current to be detected Im, are bonded together with the substrates 4A and 4B in between so that the magnetic sheets 6A and 6B apply the bias magnetic fields Hb1 and Hb2. As a result, sufficient stabilization can be attained in the detecting operation while using a space in more effective way, compared with a case where permanent magnets or coils are arranged on both sides of the MR element. Namely, since the magnetic sheets 6A and 6B can be arranged in a nearer position to each of the MR elements 3A and 3B, even the same materials are used, sufficient bias magnetic fields Hb1 and Hb2 required for a stable detecting operation can be secured with a relatively small dimension. What is more, in addition to the advantage that bulk formation is easy because of the simple configuration, even if the directions of the magnetization directions J11A and J11B in the MR elements 3A and 3B are not equal to each other, the bias magnetic fields Hb1 and Hb2 can be easily applied to a suitable direction respectively corresponding to each of the magnetization directions J11A and J11B.

In addition, the bias magnetic fields Hb1 and Hb2 having the same direction with the magnetization directions J13A and J13B under no external magnetic field H are applied to the MR elements 3A and 3B by the magnetic sheets 6A and 6B. In this manner, uniaxial anisotropy of the free layer 13 is increased, capable of fully attaining the stabilization of the magnetic field detecting operation in the MR elements 3A and 3B. Here, since shape anisotropy is not used, the shape of the MR elements 3A and 3B can be decided in more flexible way, and since they are not need to be divided into two or more pieces, a compact configuration can be realized.

Further, since the V-shaped conductor line 2 including the straight-line portion 2A and the straight-line portion 2B, which are orthogonal to each other, is employed, a more compact whole configuration can be realized compared with a case where the U-shaped conductor line including a pair of straight-line portions parallel with each other is used.

Thus, according to the current sensor 10 of the present embodiment, measurement of the current to be detected Im can be performed with high precision and in a fully stabilized way while realizing a more compact configuration.

In addition, the current sensor 10 of the present embodiment is configured in such a way that the MR elements 3A and 3B disposed along with the conductor line 2 while mutually connected in parallel so that the resistances R1 and R2 can show mutually opposite directional changes by the current magnetic fields HmA and HmB generated by the current to be detected Im flowing through the conductor line 2, the constant current source CG1 connected in series to the MR element 3A in the third junction point P3 and the constant current source CG2 connected in series to the MR element 3B in the fourth junction point P4 are provided, while the constant current source CG1 and the constant current source CG2 are connected in the second junction point P2, and the current to be detected Im is detected based on the potential difference V0 between the third junction point P3 and the fourth junction point P4 when voltage is applied between the first junction point P1 and the second junction point P2. In this way, the adjustment of an offset value in a zero magnetic field can become more simple than a case where four magnetoresistive elements are used, and sensitivity of the MR elements 3A and 3B to be used can become higher. Further, a stabilized current can be supplied equally to both of the MR elements 3A and 3B. Therefore, even if the current to be detected Im is weak, its current magnetic fields HmA and HmB can be detected with high sensitivity and high precision. It is to be noted that the balance adjustment including the MR elements 3A and 3B is needed because of the existence of the constant current sources CG1 and CG2 provided. However, since it is electrically controllable, the balance adjustment in the foregoing case is easier than a case where four magnetoresistive elements are used.

In particular, the current sensor 10 of the present embodiment further has the compensating current line C to which the compensating current Id is supplied based on a difference V0 (difference of the voltage drops produced in each of the MR elements 3A and 3B) between the potential V1 detected in the third junction point P3 and the potential V2 detected in the fourth junction point P4 so that the compensating current Id apply the compensating current magnetic field Hd having a direction opposite to the current magnetic fields HmA and HmB to the MR elements 3A and 3B, respectively. In this way, changes of the output voltage Vout resulting from the variations in the characteristics of the MR elements 3A and 3B, and in the connection resistances in the circuit or temperature distribution, etc. can be cancelled, and detection of the current magnetic fields HmA and HmB can be attained with higher sensitivity and higher precision.

In addition, the MR elements 3A and 3B, the constant current sources CG1 and CG2, and the compensating current line C are provided so as to be axisymmetrically arranged with respect to the central line CL in the current sensor 10, while the pair of straight-line portions 2A and 2B in the conductor line 2 are arranged axisymmetrically with respect to the central line CL in a plane parallel to the plane including the MR elements 3A and 3B. In this manner, the temperature distribution thereof can become symmetrical with respect to the central line CL. Therefore, the zero point drift depending on the temperature distribution can be controlled.

First Modification

Figure 9A:
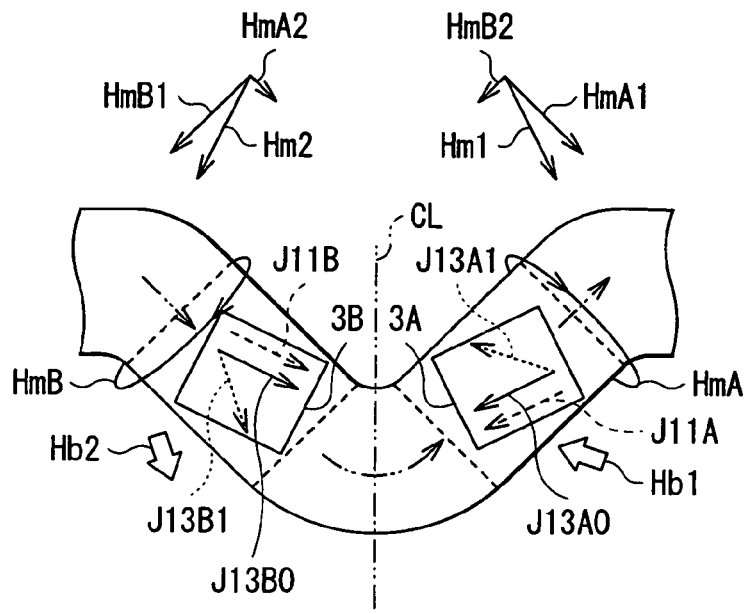
FIGS. 9A and 9B are conceptual diagrams for explaining a state of magnetization directions, current magnetic fields and bias magnetic fields in a modification of the current sensor appearing in FIG. 1.
Figure 9B:
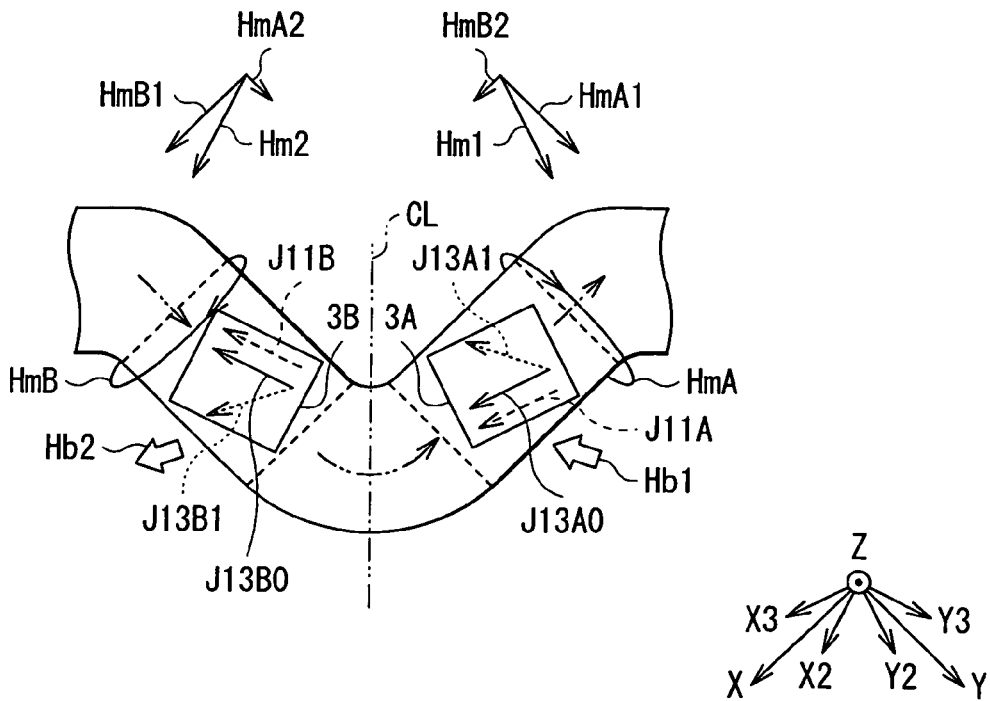

Herein, a modification of the current sensor according to the present embodiment will be explained with reference to FIGS. 9A and 9B.

As shown in FIGS. 4A and 4B, the current sensor according to the foregoing first embodiment is configured so that the magnetization directions J13A and J13B of the free layers 13 are orthogonal to the magnetization directions J11A and J11B of the pinned layers 11 when no external magnetic field H is applied. However in the present invention, as shown in the modification shown in FIGS. 9 A and 9B, the current sensor may also be configured in such a way that magnetization directions J13A0 and J13B0 of the free layers 13 are parallel to the magnetization directions J11A and J11B of the pinned layers 11, respectively when no external magnetic field H is applied. Specifically, in FIG. 9A, the magnetization direction J11A and the magnetization direction J13A0 of the MR element 3A are both in the +X3 direction orthogonal to the synthetic magnetic field Hm1, and the magnetization direction J11B and the magnetization direction J13B0 of the MR element 3B are both in the +Y3 direction orthogonal to the synthetic magnetic field Hm2. In FIG. 9B, the magnetization direction J11A and the magnetization direction J13A0 of the MR element 3A are both in the +X3 direction orthogonal to the synthetic magnetic field Hm1, and the magnetization direction J11B and the magnetization direction J13B0 of the MR element 3B are both in the −Y3 direction orthogonal to the synthetic magnetic field Hm2. However, in these cases, it is desirable to apply the bias magnetic fields Hb1 and Hb2 in an oblique direction with respect to the magnetization directions J11A and J11B. Namely, it is desirable to apply the bias magnetic fields Hb1 and Hb2 having both of a parallel component parallel to the magnetization directions J11A or J11B and an orthogonal component orthogonal to each of the parallel components. Specifically, as for FIG. 9A, it is preferred that a bias magnetic field Hb1 having the −Y3 direction is applied to the MR element 3A, and a bias magnetic field Hb2 having the +Y2 direction is applied to the MR element 3B. As for FIG. 9B, it is preferred that a bias magnetic field Hb1 having the −Y3 direction is applied to the MR element 3A, and a bias magnetic field Hb2 having the +X3 direction is applied to the MR element 3B. Herein, the parallel components of the bias magnetic fields Hb1 and Hb2, corresponding to an anisotropic magnetic field, increase the uniaxial anisotropy of the free layers 13 as described in the foregoing first embodiment, consequently contributing to stabilization of the magnetic field detecting operation in the MR elements 3A and 3B. On the other hand, the orthogonal components orthogonal to the parallel components are needed because of the following reasons.

Figure 10:
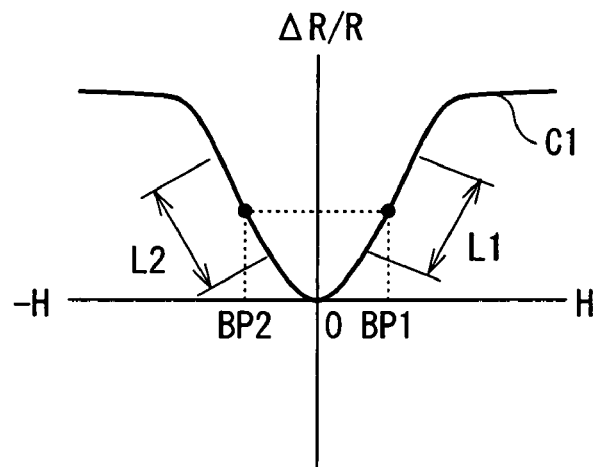
FIG. 10 is a characteristic diagram showing the dependency of the resistance change ratio on the magnetic field in the modification as shown in FIG. 9.

If the external magnetic field H is applied to the magnetoresistive elements 3A and 3B that are set so that the magnetization directions J13A0 and J13B0 and the magnetization directions J11A and J11B are mutually parallel in an unloaded condition in the direction orthogonal to the magnetization directions J11A and J11B, respectively, characteristics as shown in FIG. 10 can be obtained. FIG. 10 shows a relation between the external magnetic field H and a resistance change ratio ΔR/R letting the external magnetic field H in the +Y direction be a positive external magnetic field H. As shown herein, the relation therebetween is expressed by one curve C1 in which the value becomes the minimum (ΔR/R=0) when the external magnetic field H=0 and which hardly shows hysteresis. In this case, since 1/f noise caused by hysteresis is extremely small, high-sensitive and stable sensing can be realized. However, as is clear from FIG. 10, a linear variation is not obtained in the vicinity of no external magnetic field H is applied (H=0). For this reason, bias magnetic fields Hb1 and Hb2 having an orthogonal component orthogonal to the magnetization directions J11A and J11B are applied to the MR elements 3A and 3B in actually measuring the current magnetic fields HmA and HmB so that the magnetization directions J13A0 and J13B0 are rotated, for example, by 45 degrees to become magnetization directions J13A1 and J13B1 (FIGS. 9A and 9B). In this manner, variation in the current magnetic fields HmA and HmB are detectable with good precision in the linear areas L1 and L2 including bias points BP1 and BP2 at their midpoints as indicated in FIG. 10.

It is to be noted that in the present modification, by applying the bias magnetic fields Hb1 and Hb2 in suitable directions, resistance R1 of the MR element 3A and resistance R2 of the MR element 3B show a mutually opposite variation when current magnetic fields HmA and HmB are generated. Therefore, current to be detected Im can be measured by supplying a constant current of a mutually equal value to the MR elements 3A and 3B, and by detecting the difference of voltage drops produced in the MR elements 3A and 3B by the constant current.

Second Embodiment

A current sensor as a second embodiment according to the present invention will be explained next. Although in the foregoing first embodiment is explained the case in which the conductor line 2 having V-shaped configuration (in plan view) is used, in the second embodiment is explained a case in which a straight-line shaped conductor line 21 is employed.

Figure 11A:
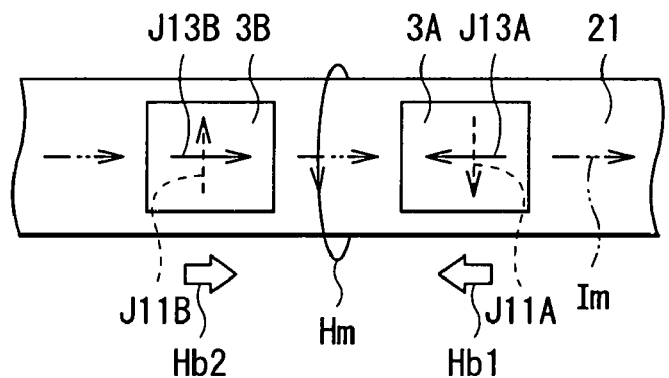
FIGS. 11A and 11B are conceptual diagrams for explaining a state of magnetization directions, current magnetic fields and bias magnetic fields in a current sensor according to a second embodiment of the present invention.
Figure 11B:
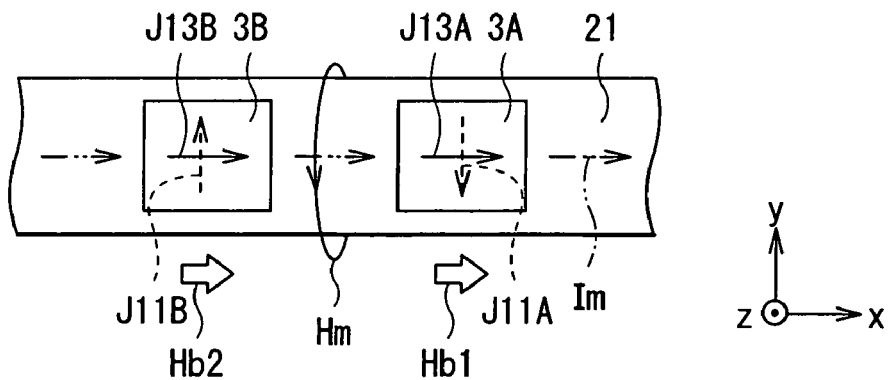

Since the current sensor of the second embodiment has substantially the same configuration as that of the above-mentioned first embodiment except for the conductor line 21, here is explained the relation among the magnetization directions J11 and J13 of the GMR films in the MR elements 3A and 3B, the bias magnetic field Hb, and the current magnetic field Hm with reference to FIGS. 11A and 11B. FIGS. 11A and 11B are conceptual diagrams about the relation among the current direction, the magnetic field direction, and the magnetization direction according to the current sensor of the second embodiment. Here, a current to be detected Im is flowing along the extending direction of the conductor line 21 and the magnetization direction J11 of the pinned layer 11 is pinned in the direction orthogonal to the current to be detected Im. On the other hand, the magnetization direction J13 of the free layer 13 is either parallel or antiparallel to the flowing direction of the current to be detected Im when no external magnetic field H is applied. Namely, when no external magnetic field H is applied, the magnetization direction J13 of the free layer 13 is orthogonal to the magnetization direction J11 of the pinned layer 11. Therefore, when the current magnetic field Hm is generated, the magnetization direction J13 approaches a parallel state (low resistance) or antiparallel (high resistance) with respect to the magnetization direction J11. Here, the MR element 3A and MR element 3B are set so that their resistances R1 and R2 develop an opposite-directional variation each other according to the current magnetic field Hm. Specifically, as shown in FIG. 11A, the MR element 3A has the magnetization direction J11A in the −y direction and the magnetization direction J13A in the −x direction when no external magnetic field H is applied, for example. On the other hand, the MR element 3B has the magnetization direction J11B in the +y direction and the magnetization direction J13B in the +x direction when no external magnetic field H is applied. In this case, when the current to be detected Im flows as indicated by arrows to generate the current magnetic field Hm, the magnetization direction J13A is rotated counterclockwise (on the drawing sheet) to be parallel to the magnetization direction J11A, while the magnetization direction J13B is rotated clockwise (on the drawing sheet) to be antiparallel to the magnetization direction J11B. Or as shown in FIG. 11B, the magnetization direction J11A may be in the −y direction while the magnetization direction J13A when no external magnetic field H is applied may be in the +x direction in the MR element 3A, while the magnetization direction J11B may be in the +y direction and the magnetization direction J13B when no external magnetic field H is applied may be in the +x direction. In this case, when current to be detected Im flows in the direction of arrows to generate the current magnetic field Hm, the magnetization direction J13A is rotated clockwise to come to a state parallel to the magnetization direction J11A, while the magnetization direction J13B is rotated clockwise to come to a state of antiparallel to the magnetization direction J11B.

In each case, the bias magnetic fields Hb1 and Hb2 are set so as to be in the same direction with the magnetization directions J13A and J13B when no external magnetic field H is applied, respectively. Therefore, the bias magnetic fields Hb1 and Hb2 increase the uniaxial anisotropy of the free layer 13 as corresponding to an anisotropic magnetic field, consequently contributing to stabilization of the magnetic field detecting operation in the MR elements 3A and 3B. In particular, since the current sensor of the second embodiment employs the straight-line conductor line 21, the current magnetic field Hm of a generally uniformed quality can be generated without producing an interaction like in the case of the U-shaped or V-shaped conductor lines. For this reason, the current magnetic field Hm extends efficiently to the MR elements 3A and 3B, and current measurement can be made with higher precision. If the magnetization directions J11A and J11B are arranged so as to be orthogonal to the flowing direction of the current to be detected Im (namely, the extending direction of the conductor line 21), the highest sensitivity measurement can be attained. Therefore, when the V-shaped conductor line 2 is used (the first embodiment), the magnetic sensors 7A and 7B are leaned to the extending direction of the conductor line 2 but it is not necessary in the second embodiment, and the magnetic sensors 7A and 7B can be installed simple.

Further, in the current sensor of the second embodiment, since the conductor line 21 has a straight-line shape, two-dimensional spread can be restrained compared with the above-mentioned first embodiment using the V-shaped conductor line 2, the entire configuration can be made more compact. However, since the magnetization direction J11A and the magnetization direction J11B are in antiparallel mutually as is clear from FIGS. 11A and 11B, the gap between the MR element 3A and the MR element 3B is necessary to be larger than a gap W3 shown in FIGS. 4A and 4B in order to avoid interaction of the bias magnetic field Hb1 and the bias magnetic field Hb2.

As described above, according to the second embodiment, since the conductor line 21 of straight-line shape in plan view is employed and the element substrates 5A and 5B including the MR elements 3A and 3B are disposed along with the conductor line 21, the gap between the MR elements 3A and 3B can be made smaller than the case of the U-shaped conductor line while capable of maintaining the dimension of the MR elements 3A and 3B as they are. Further, since the straight-line conductor line has no folded portion unlike the U-shaped conductor line, the dimension of the conductor line 21 can be made smaller. Therefore, a more compact entire configuration can be realized while maintaining the dimension of the MR elements 3A and 3B. What is more, the errors of measurement caused by the difference of temperature between the MR elements 3A and 3B are reduced, and consequently, the current measurement with good precision and stability can be realized.

Second Modification

Subsequently, a modification in the current sensor of the second embodiment will be explained with reference to FIG. 12.

Figure 12A:
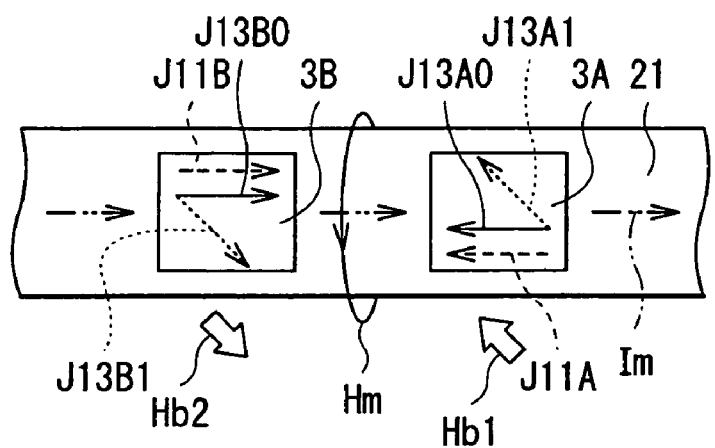
FIGS. 12A and 12B are conceptual diagrams for explaining a state of magnetization directions, current magnetic fields and bias magnetic fields in a modification of the current sensor appearing in FIG. 11.
Figure 12B:
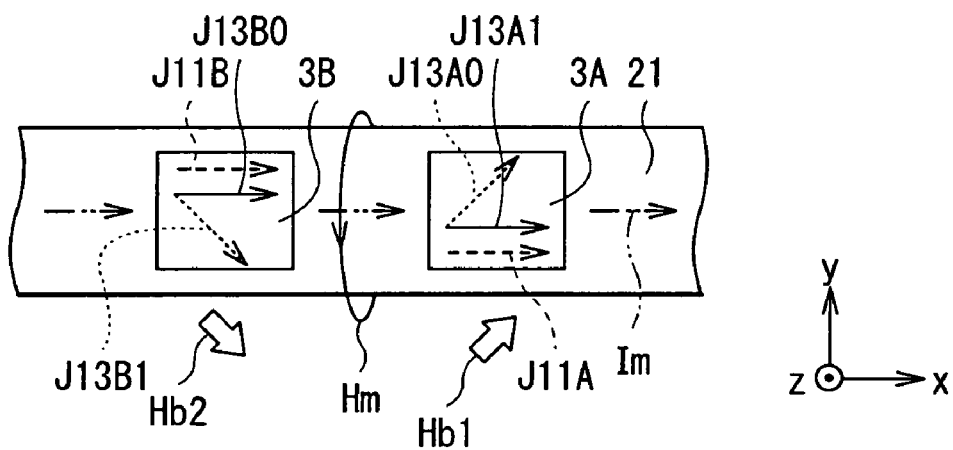

According to the above-mentioned second embodiment, as shown in FIGS. 11A and 11B, the current sensor is configured in such a way that the magnetization directions J13A and J13B of the free layers 13 and the magnetization directions J11A and J11B of the pinned layers 11 are respectively orthogonal to each other when no external magnetic field H is applied. However, like the modification shown in FIGS. 12A and 12B, the current sensor may be configured in such a way that the magnetization directions J13A0 and J13B0 of the free layers 13 and the magnetization directions J11A and J11B of the pinned layers 11 are respectively parallel to each other when no external magnetic field H is applied. Specifically, the magnetization direction J11A and the magnetization direction J13A0 of the MR element 3A are both in the −x direction orthogonal to the current magnetic field Hm, and the magnetization direction J11B and the magnetization direction J13B0 of the MR element 3B both have the +x direction orthogonal to the current magnetic field Hm as shown in FIG. 12A. In FIG. 12B, all of the magnetization direction J11A and the magnetization direction J13A0 of the MR element 3A and the magnetization direction J11B and the magnetization direction J13B0 of the MR element 3B are in the +x direction. However, it is desirable to apply the bias magnetic fields Hb1 and Hb2 in an oblique direction to the magnetization directions J11A and J11B in these cases. Namely, it is desirable to apply the bias magnetic fields Hb1 and Hb2 having both of a parallel component parallel to the magnetization directions J11A and J11B and an orthogonal component orthogonal to each of the parallel components. In this manner, the free layers 13 comes to develop the magnetization directions J13A1 and J13B1 inclined to the magnetization directions J11A and J11B by 45 degrees, for example. As a result, variation in the current magnetic fields Hm is detectable with good precision in the linear areas L1 and L2 including the bias points BP1 and BP2 at their midpoints as shown in FIG. 10.

Third Embodiment

Next, the current sensor as a third embodiment according to the present invention will be explained. In the first embodiment as described above is explained the case of arranging the two MR elements 3A and 3B on the straight-line portions 2A and 2B of the conductor line 2. On the other hand, in the third embodiment, four MR elements 3A-3D are arranged on one conductor line 2. Explanation will be made hereinbelow with reference to FIG. 13. Since its configuration is substantially similar to that of the above-mentioned first embodiment except for the point that the number of arrangement of the MR elements 3A-3D is four, descriptions are omitted suitably according to circumstances.

Figure 13:
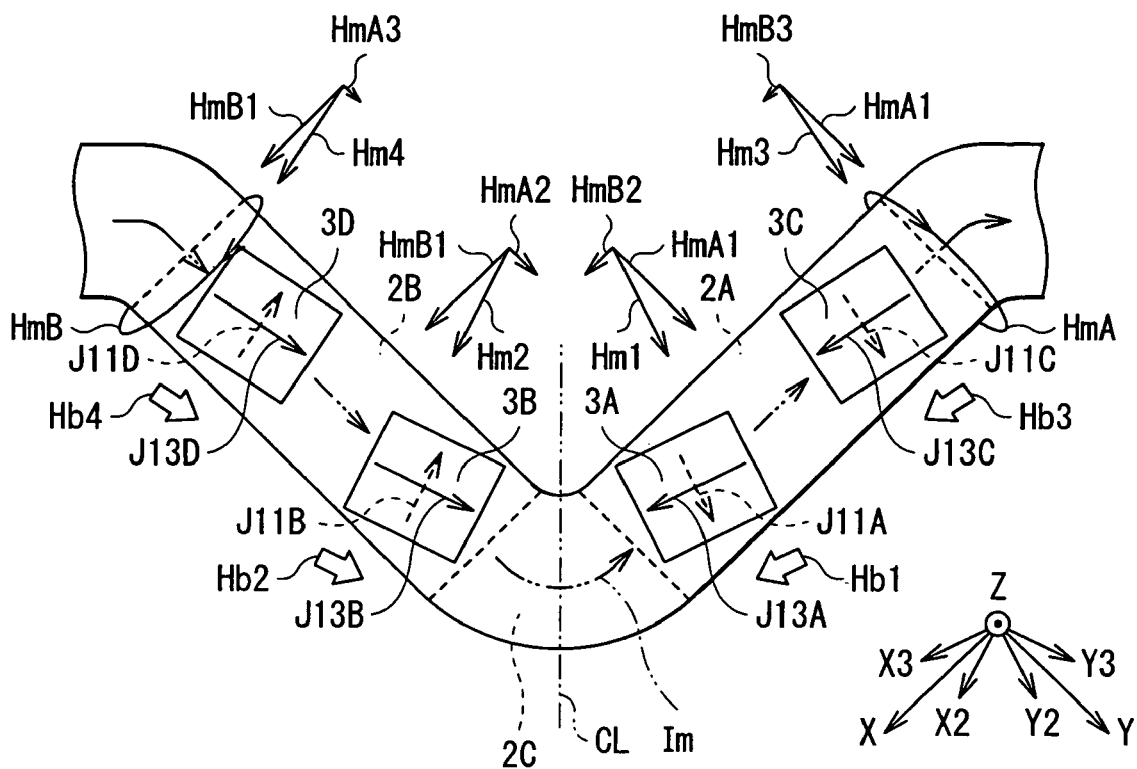
FIG. 13 is a conceptual diagram for explaining a state of magnetization directions, current magnetic fields and bias magnetic fields in a current sensor according to a third embodiment of the present invention.

FIG. 13 is a conceptual diagram showing the relation among the current direction, magnetic field direction, and magnetization direction of the current sensor according to the third embodiment. As shown in FIG. 13, in the current sensor of the third embodiment, the straight-line portion 2A is provided with the MR element 3A and the MR element 3C along with the extending direction thereof (in the x-axis direction). On the other hand, the straight-line portion 2B is provided with the MR element 3B and the MR element 3D along with the extending direction thereof (in the y-axis direction). It is to be noted that the MR elements 3A-3D are arranged on the substrates (not shown) respectively to form an element substrate. Further, a magnetic sheet (not shown) is arranged between each substrate and the conductor line 2 so as to apply the bias magnetic fields Hb1-Hb4 to the MR elements 3A-3D, respectively.

For example, supposing a current to be detected Im flows along the extending direction of the conductor line 2 as shown by arrows, a current magnetic field HmA is generated around the straight-line portion 2A, and current magnetic field HmB is generated around the straight-line portion 2B. In this case, as indicated by vectors, a synthetic magnetic field Hm1, which is a resultant force of a magnetic field component HmA1 in the +Y direction caused by the current magnetic field HmA and a magnetic field component HmB2 in the +X direction caused by the current magnetic field HmB, is applied to the MR element 3A. Similarly, a synthetic magnetic field Hm2, which is a resultant force of a magnetic field component HmA2 in the +Y direction caused by the current magnetic field HmA and a magnetic field component HmB1 in the +X direction caused by the current magnetic field HmB, is applied to the MR element 3B. To the MR element 3C, a synthetic magnetic field Hm3, which is a resultant force of the magnetic field component HmA1 in the +Y direction caused by the current magnetic field HmA and a magnetic field component HmB3 in the +X direction caused by the current magnetic field HmB, is applied. To the MR element 3D, a synthetic magnetic field Hm4, which is a resultant force of a magnetic field component HmA3 in the +Y direction caused by the current magnetic field HmA and the magnetic field component HmB1 in the +X direction caused by the current magnetic field HmB, is applied. Here, since the MR elements 3C and 3D are located in the position far from the centre position CL compared with the MR elements 3A and 3B, they are hardly influenced by the interaction of the current magnetic field HmA and the current magnetic field HmB. Namely, the magnetic field component HmB3 is smaller than the magnetic field component HmB2 (HmB3<HmB2), and the magnetic field component HmA3 is smaller than the magnetic field component HmA2 (HmA3<HmA2). Therefore, the synthetic magnetic field Hm3 has a direction nearer to the +Y direction than the synthetic magnetic field Hm1, and the synthetic magnetic field Hm4 has a direction nearer to the +X direction than the synthetic magnetic field Hm2.

The MR elements 3A and 3C are pinned in such a way that the magnetization directions J11A and J11C of the pinned layers 11 are parallel to the synthetic magnetic fields Hm1 and Hm3, respectively. On the other hand, the MR elements 3B and 3D are pinned in such a way that the magnetization directions J11B and J11D of the pinned layers 11 are antiparallel to the synthetic magnetic fields Hm2 and Hm4, respectively. When no external magnetic field H is applied, the magnetization directions J13A and J13C of the free layers 13 is in a state of slightly tilting in the −Y direction from the +X direction so as to be orthogonal to the synthetic magnetic fields Hm1 and Hm3, respectively. The magnetization directions J13B and J13D are in the state of slightly tilting in the −X direction from +Y direction so as to be orthogonal to the synthetic magnetic fields Hm2 and Hm4, respectively. Namely, when no external magnetic field H is applied, the magnetization directions J13A-J13D are in a state of being orthogonal to the magnetization directions J11A-J13D, respectively. Therefore, if a current to be detected Im is supplied to the conductor line 2 to generate the synthetic magnetic fields Hm1-Hm4, the magnetization directions J13A and J13C approach a state of being parallel (low resistance) to the magnetization directions J11A and J11C, respectively, and the magnetization directions J13B and J13D approach a state of being antiparallel (high resistance) to the magnetization directions J11B and J11D, respectively. Therefore, resistances R1 and R3 of the MR elements 3A and 3C are reduced, and resistances R2 and R4 of the MR elements 3B and 3D are increased.

Figure 14:
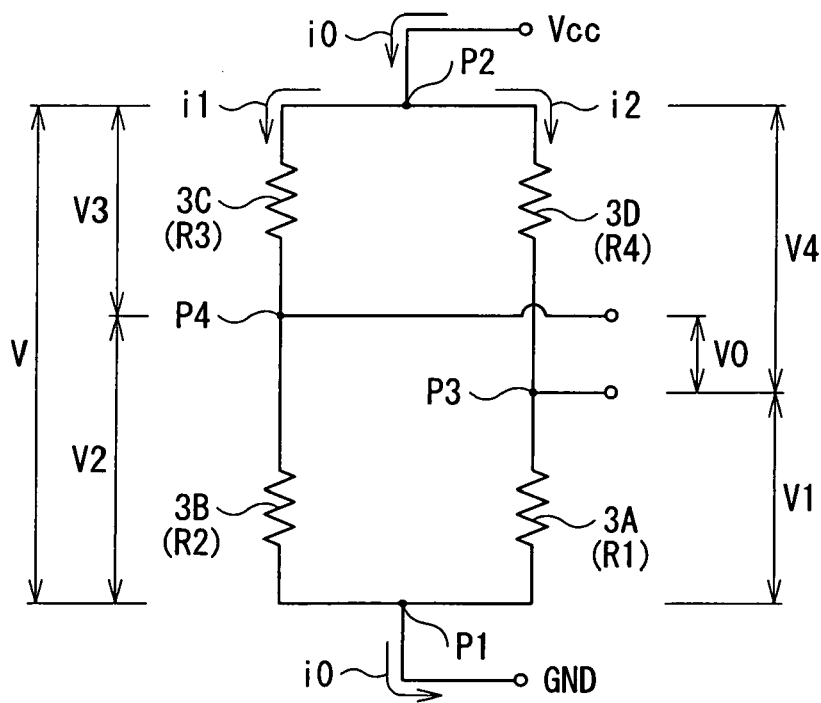
FIG. 14 is a circuit diagram corresponding to the current sensor shown in FIG. 13.

As shown in FIG. 14, in the current sensor of the third embodiment, ends of the MR elements 3A and 3B are connected each other in a first junction point P1, ends of the MR elements 3C and 3D are connected each other in a second junction point P2, the other end of the MR element 3A and the other end of the MR element 3D are connected each other in a third junction point P3, and the other end of the MR element 3B and the other end of the MR element 3C are connected each other in a fourth junction point P4. Consequently, a bridge circuit is formed. FIG. 14 shows a circuit configuration in the current sensor of the third embodiment.

Hereafter, a method of measuring the current magnetic fields HmA and HmB generated by the current to be detected Im will be explained with reference to FIG. 14.

In FIG. 14, a state where the external magnetic field H is not applied is considered first. Each resistance of the MR elements 3A-3D in sending a read current i0 is expressed by r1-r4. The read current i0 flowing from a power supply Vcc is split into two, a read current $i_1$ and a read current i2, in the second junction point P2. Then, the read current i1 which passed the MR element 3C and the MR element 3B, and the read current i2 passing the MR element 3D and the MR element 3A join in the first junction point P1. In this case, potential difference V between the second junction point P2 and the first junction point P1 is expressed as follows:

$$V = i1 \times r3 + i1 \times r2 = i2 \times r4 + i2 \times r1 \qquad (4)$$
$$= i1 \times (r3 + r2) = i2 \times (r4 + r1)$$

Potential V3 in the fourth junction point P4, and potential V4 in the third junction point P3 can be expressed as follows:

$$V3 = V - i1 \times r3$$

$$V4 = V - i2 \times r4$$

Therefore, potential difference V0 of the fourth junction point P4 and the third junction point P3 can be expressed as follows:

$$V0 = V4 - V3 \qquad (5)$$
$$= (V - i2 \times r4) - (V - i1 \times r3)$$
$$= i1 \times r3 - i2 \times r4$$

Here, it can be rewritten base on the equation (4) as follows:

$$V0 = \{r3/(r3 + r2)\} \times V - \{r4/(r4 + r1)\} \times V \qquad (6)$$
$$= \{r3/(r3 + r2) - r4/(r4 + r1)\} \times V$$

In this bridge circuit, resistance variation amount can be obtained by measuring the potential difference V0 between the fourth junction point P4 and the third junction point P3 as expressed with the above-mentioned equation (6) when the current magnetic fields HmA and HmB which are an external magnetic field is applied. Here, supposing the resistances R1-R4 are changed by the variation amount of $\Delta R1$-$\Delta R4$, respectively when the current magnetic fields HmA and HmB are applied, that is, letting each of the resistance values R1-R4 after application of the current magnetic fields HmA and HmB be $$R1 = r1 + \Delta R1$$

$$R2 = r2 + \Delta R2$$

$$R3 = r3 + \Delta R3$$

$$R4 = r4 + \Delta R4,$$

the potential difference V0 at the time of the application of the current magnetic fields HmA and HmB can be expressed as follows based on the equation (6):

$$V0 = \{(r3+\Delta R3)/(r3+\Delta R3+r2+\Delta R2) - (r4+\Delta R4)/(r4+\Delta R4+r1+\Delta R1)\} \times V \quad (7)$$

Since the current sensor is configured so as to show an opposite-directional variation mutually between the resistance R1 of the MR element 3A and the resistance R2 of the MR element 3B, or between the resistance R3 of the MR element 3C and the resistance R4 of the MR element 3D, the values of variation $\Delta R4$ and variation $\Delta R1$ cancel each other, and variation $\Delta R3$ and variation $\Delta R2$ cancel each other. For this reason, in comparing values before/after the application of the current magnetic fields HmA and HmB, the denominator values in each term are scarcely increased in the equation (7). On the other hand, as for the numerator value in each term, increase or decrease appears since variation $\Delta R3$ and variation $\Delta R1$ have mutually opposite positive/negative signs without fail.

Supposing that all the MR elements 3A-3D have the same characteristics completely, that is, letting $r1=r2=r3=r4=R$ and $\Delta R1=-\Delta R2=\Delta R3=-\Delta R4=\Delta R$, the equation (7) is given as:

$$V0 = \{(R+\Delta R)/(2 \times R) - (R-\Delta R)/(2 \times R)\} \times V$$

$$= (\Delta R/R) \times V$$

Thus, if the MR elements 3A-3D whose characteristic values, such as $\Delta R/R$, are already known are used, the intensity of the current magnetic fields HmA and HmB can be measured and consequently, the magnitude of current to be detected Im generating the current magnetic fields HmA and HmB can be estimated. Since sensing is performed using the four MR elements 3A-3D, measurement with higher precision can be realized compared with a case where sensing is performed using only two MR elements 3A and 3B.

Although the case of using the conductor line 2 having V-shaped configuration (in plan view) is explained in the third embodiment, the present invention is not limited to this and it is also possible to arrange the four MR elements 3A-3D along with the straight-line shaped conductor line 21 explained in the second embodiment, for example.

Example

Next, an example of the present invention will be explained hereinbelow.

Figure 15:
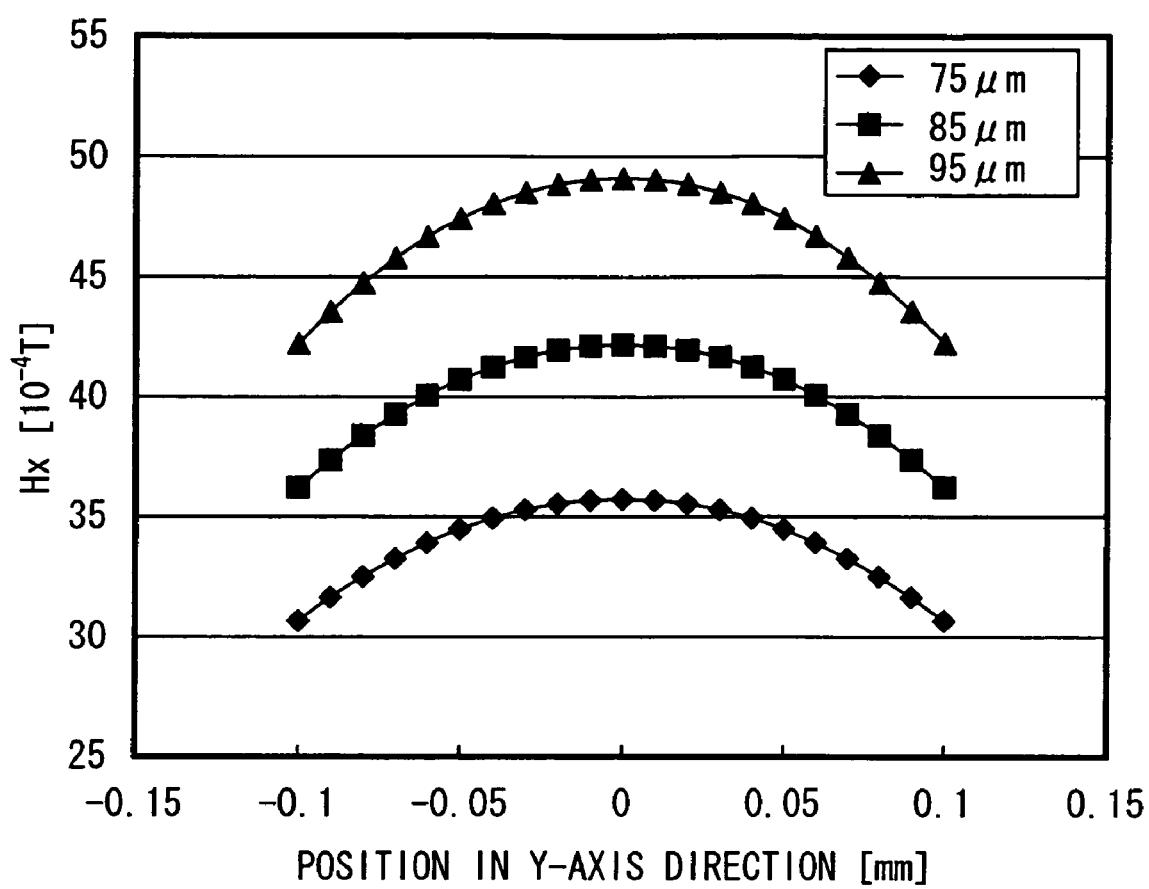
FIG. 15 is a characteristic diagram showing distribution of bias magnetic fields Hx in a magnetic sheet of the current sensor shown in FIG. 9.
Figure 16:
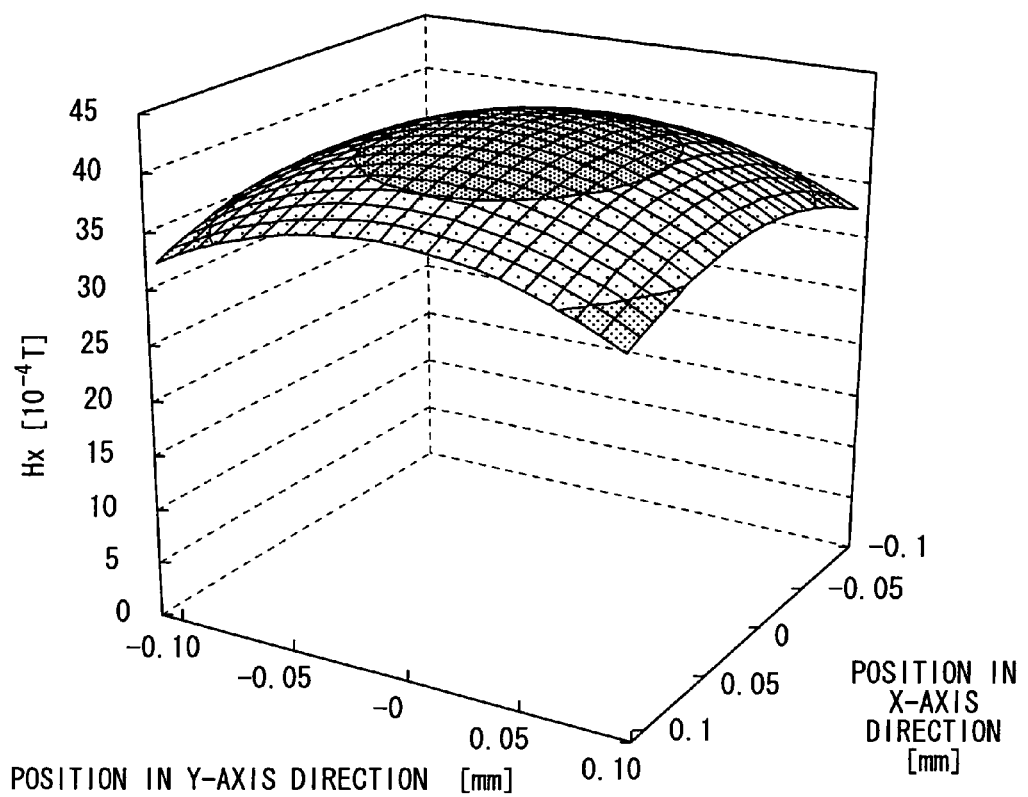
FIG. 16 is another characteristic diagram showing distribution of bias magnetic fields Hx in the magnetic sheet of the current sensor shown in FIG. 9.
Figure 17:
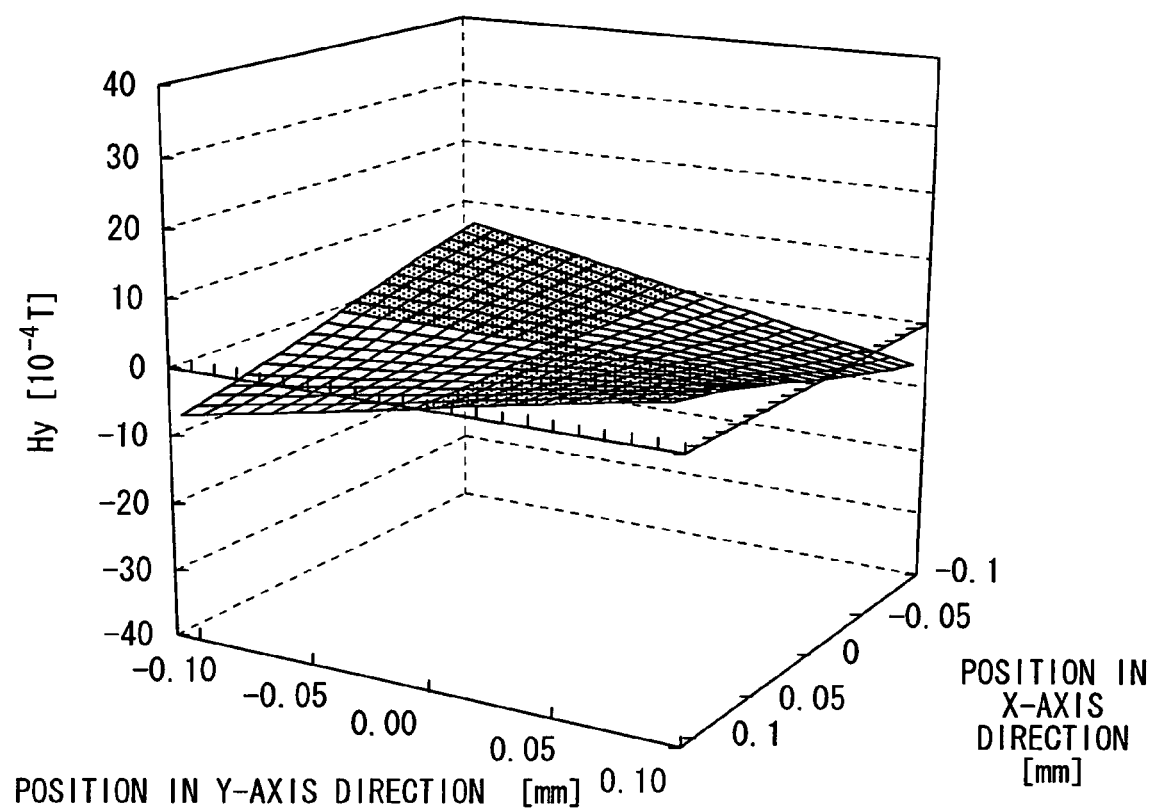
FIG. 17 is a characteristic diagram showing distribution of bias magnetic fields Hy in the magnetic sheet of the current sensor shown in FIG. 9.

In the present example, a sample was produced corresponding to the MR element 3B in the above-mentioned second embodiment (FIGS. 11A, 11B), and distribution of the bias magnetic field produced by the magnetic sheet was investigated with regard to the sample. Herein, based on a micromagnetics simulation, a bias magnetic field Hx as a magnetic field component in the x-axis direction orthogonal to the magnetization direction of the pinned layer, and a bias magnetic field Hy as a magnetic field component in the y-axis direction parallel to the magnetization direction of the pinned layer were respectively computed on the basis of the magnetic sheet face. The result is shown in FIGS. 15-17. It is to be noted that the magnetic sheet was magnetized in the x-axis direction to have a function of securing the operation stability of the MR elements by applying the bias magnetic field in the direction of x (orthogonal to the magnetization direction of the pinned layer) to the MR element. The simulation was performed under the condition that the x directional dimension of the magnetic sheet was 0.37 mm and the y directional dimension of the magnetic sheet was 0.26 mm. Only an area of 0.2 mm (in the x-axis direction)×0.2 mm (in the y-axis direction) including the centre positions thereof is shown in FIGS. 15-17.

FIG. 15 shows a distribution of the bias magnetic field Hx in the y-axis direction. Here, the horizontal axis represents positions (mm) in the y-axis direction passing through the centre position of the magnetic sheet, and the vertical coordinate expresses the bias magnetic field Hx. Here, three thickness levels of magnetic sheets (75 μm, 85 μm, and 95 μm) were prepared. As shown in FIG. 15, every thickness level shows a similar distribution state of gentle convex shape having the centre position 0 as its peak for indicating the intensity of the bias magnetic field Hx. It was also confirmed that the intensity of the bias magnetic field Hx could be increased by enlarging the thickness, and the intensity of the bias magnetic field Hx could be reduced by reducing the thickness.

FIG. 16 is a characteristic diagram showing a distribution of bias magnetic field Hx developed by the magnetic sheet having a thickness of 85 μm, in the y-axis directional positions (mm) and in the x-axis directional positions (mm). In FIG. 16, the centre position in each of the x axis and the y axis was set to the origin (zero point). As shown in FIG. 16, the distribution of the bias magnetic field Hx was a shape of curved surface within a range from $32\times10^{-4}$[T] to $43\times10^{-4}$[T], in which the cross-point of each of the centre positions (namely, the zero points) in both of the x-axis direction and the y-axis direction of the magnetic sheet was the apex. Namely, it proved that the biggest bias magnetic field Hx was obtained in the centre position of the magnetic sheet.

FIG. 17 shows a distribution of bias magnetic field Hy in the y-axis direction and the x-axis direction. Here, the centre position in each of the x-axis and the y-axis directions was set as the origin (zero point) similar to the bias magnetic field Hx. Here, in order to secure the operational stability of the MR elements, it is desirable that intensity of the bias magnetic field Hy is zero. As shown in FIG. 17, it proved that the bias magnetic field Hy was zero in the centre position of the magnetic sheet, but the absolute value of the bias magnetic field Hy was slightly increasing as going to the periphery. However, the absolute value of the bias magnetic field Hy is a very small value less than $10\times10^{-4}$[T], with which level no practical problem occurs. It is to be noted that in FIG. 17, the bias magnetic field Hy shows the mutually opposite positive/negative signs between the positive area (from 0 mm to −0.1 mm) and the negative area (from 0 mm to 0.1 mm) of the x-axis direction. The phenomenon means that the bias magnetic field Hy has a mutually opposite direction on both sides of the centre position of the x axis on the magnetic sheet. Similarly, the bias magnetic field Hy shows the mutually opposite positive/negative signs between the positive area (from 0 mm to −0.1 mm) and the negative area (from 0 mm to 0.1 mm) of the y-axis direction. The phenomenon means that the bias magnetic field Hy has a mutually opposite direction on both sides of the centre position of the y axis on the magnetic sheet.

As a result of FIGS. 15-17, it proved that a bias magnetic field component (the bias magnetic field Hx) in the originally necessary direction could be applied most efficiently if the MR element was arranged in the centre position of the magnetic sheet, and what is more, the influence of the bias magnetic field component (bias magnetic field Hy) in the unnecessary direction could be reduced. It was also confirmed that the bias magnetic field of a desired intensity could be given to the MR element by selecting a thickness of the magnetic sheet.

Figure 18:
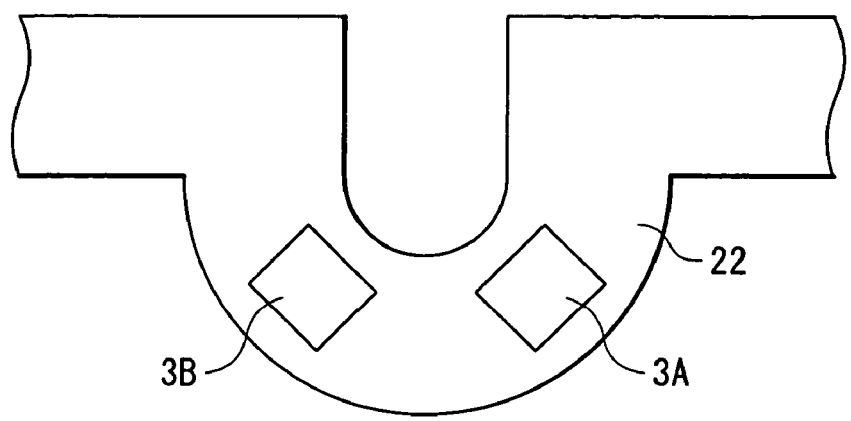
FIG. 18 is a schematic diagram showing a first modification of a conductor line used in the current sensor appearing in FIG. 1.
Figure 19:
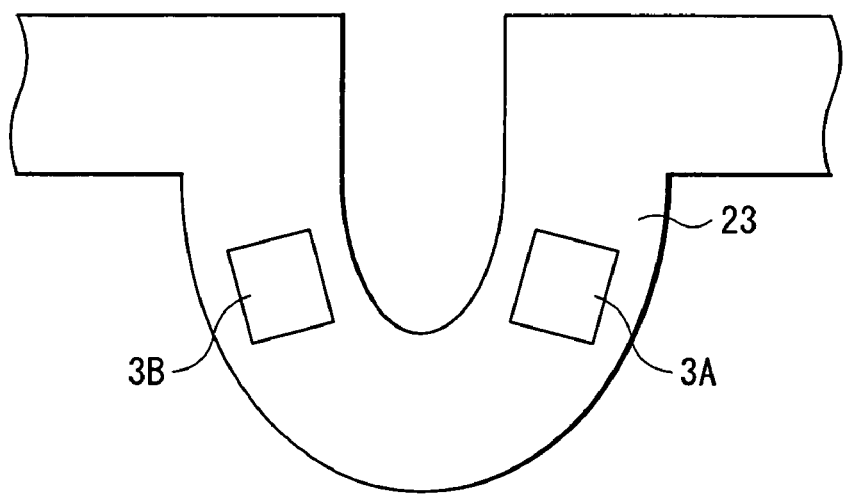
FIG. 19 is a schematic diagram showing a second modification of the conductor line used in the current sensor appearing in FIG. 1.
Figure 20:
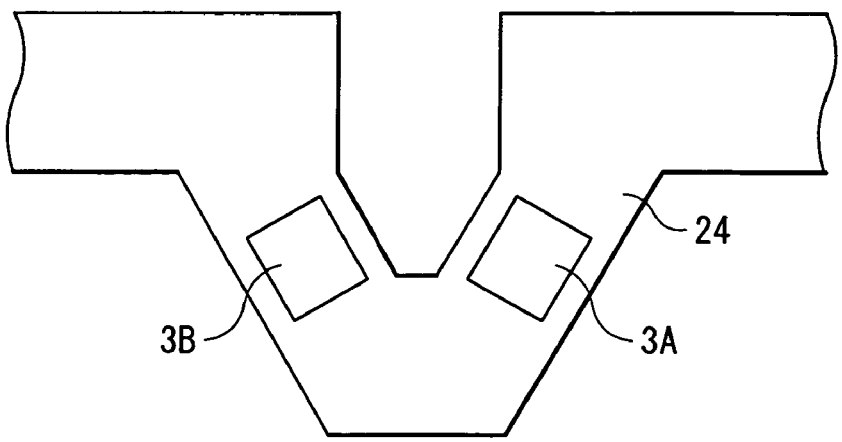
FIG. 20 is a schematic diagram showing a third modification of the conductor line used in the current sensor appearing in FIG. 1.

As mentioned above, although the present invention has been explained with reference to some embodiments and modifications, the present invention is not limited to the above-mentioned embodiments etc. and various kinds of modifications are possible. For example, in the above-mentioned embodiments, there is explained a case of V-shaped conductor line having two straight-line portions orthogonal to each other, but V-shaped conductor line is not limited to this. Namely, if a conductor line having two straight-line portions has a mutual angle of more than zero and less than 180 degrees, the conductor line corresponds to "the V-shaped conductor line" according to the present invention. Further, a conductor line 22 including a semicircle as shown in FIG. 18, and a conductor line 23 including a part of an ellipse as shown in FIG. 19 are also included in the concept of the "V-shaped conductor line" of the present invention. Still further, a conductor line 24 forming only of straight-line portions as shown in FIG. 20 is also included in the "V-shaped conductor line" of the present invention.

Obviously, many modifications and variations of the present invention are possible in the light of the above teachings. It is therefore to be understood that within the scope of the appended claims the invention may be practiced otherwise than as specifically described.

What is claimed is:

1. A current sensor comprising:
    a conductor line having a V-shaped flat surface, the V-shaped flat surface being spread over a two-dimensional plane; and
    a pair of magnetoresistive elements disposed along with the conductor line so that a resistance value of one of the magnetoresistive elements changes in a direction opposite to that of resistance-value-change of the other magnetoresistive element according to current magnetic fields produced by a current to be detected flowing through the conductor line; and
    a pair of bias applying means,
    wherein one of the pair of magnetoresistive elements is disposed on a first arm portion of a pair of arm portions configuring a V shape of the conductor line,
    the other of the pair of magnetoresistive elements is disposed on a second arm portion of the pair of arm portions, and
    one side of the pair of magnetoresistive elements is disposed on one side of the first arm portion, and another side of the pair of magnetoresistive elements is disposed on one side of the second arm portion and detects the induction field induced by the current flowing through the opposing arm portions, and
    the pair of magnetoresistive elements includes: a pinned layer having a magnetization direction pinned to a direction; a free layer whose magnetization direction changes according to an external magnetic field, while the magnetization direction under no external magnetic field is parallel or antiparallel to a direction in which the conductor line is extending; and an intermediate layer inserted between the pinned layer and the free layer; and
    the magnetization direction of the pinned layer is parallel to the magnetization direction of the free layer when no external magnetic field is applied, and
    the pair of bias applying means each applying a bias magnetic field to each of the pair of magnetoresistive elements, respectively, the bias magnetic field having a parallel component parallel to the magnetization direction of the pinned layer and an orthogonal component orthogonal to the parallel component.

2. The current sensor according to claim 1, wherein the magnetization direction of the pinned layer is orthogonal to the magnetization direction of the free layer when no external magnetic field is applied.

3. The current sensor according to claim 2, further comprising a pair of bias applying means each applying a bias magnetic field to each of the magnetoresistive elements in a direction same as that of the magnetization direction of the free layer under no external magnetic field.

4. The current sensor according to claim 3, wherein the bias applying means is a magnetic sheet attached on one side of the magnetoresistive element.

5. The current sensor according to claim 1, wherein the bias applying means is a magnetic sheet attached on one side of the magnetoresistive elements.

6. The current sensor according to claim 1, further comprising:
    a pair of constant current sources each supplying a constant current of a common magnitude to each of the magnetoresistive elements; and
    a difference detector detecting a difference in the voltage drops resulting from the constant current in each of the magnetoresistive elements.

* * * * *